US006461731B1

(12) United States Patent
Veerasamy et al.

(10) Patent No.: US 6,461,731 B1
(45) Date of Patent: *Oct. 8, 2002

(54) SOLAR MANAGEMENT COATING SYSTEM INCLUDING PROTECTIVE DLC

(75) Inventors: Vijayen S. Veerasamy, Farmington Hills; Rudolph Hugo Petrmichl, Ann Abor; Scott V. Thomsen, Milford, all of MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/698,129

(22) Filed: Oct. 30, 2000

Related U.S. Application Data

(63) Continuation-in-part of application No. 09/698,126, filed on Oct. 30, 2000, and a continuation-in-part of application No. 09/617,815, filed on Jul. 17, 2000, now Pat. No. 6,312,808, and a continuation-in-part of application No. 09/583,862, filed on Jun. 1, 2000, now Pat. No. 6,335,086, and a continuation-in-part of application No. 09/442,805, filed on Nov. 18, 1999, now Pat. No. 6,338,901, and a continuation-in-part of application No. 09/303,548, filed on May 3, 1999, now Pat. No. 6,261,693.

(51) Int. Cl.[7] ............................................. B32B 17/06

(52) U.S. Cl. .................. 428/408; 428/428; 428/446; 428/432; 428/433; 428/469; 428/472; 428/698

(58) Field of Search ................................ 428/408, 472, 428/469, 446, 698, 433, 432, 428

(56) References Cited

U.S. PATENT DOCUMENTS

| 3,959,577 | 5/1976 | Frink |
| 4,060,660 | 11/1977 | Carlson et al. |
| 4,210,431 | 7/1980 | Bachman et al. |
| 4,263,350 | 4/1981 | Valimont |

(List continued on next page.)

FOREIGN PATENT DOCUMENTS

| EP | 0 499 287 A1 | 8/1992 |
| NL | 8800607 | 10/1989 |
| WO | WO 86/00093 | 1/1986 |
| WO | WO 89/08856 | 9/1989 |
| WO | WO 04/12680 | 6/1994 |
| WO | WO 98/26926 | 6/1998 |
| WO | WO 98/45847 | 10/1998 |
| WO | WO 00/56127 | 9/2000 |
| WO | WO 01/36342 | 5/2001 |

OTHER PUBLICATIONS

US 4,960,645, 10/1990, Linge et al. (withdrawn)
"6001 Chemical Abstracts", Columbus, Ohio (1996) 1 pg No month.
"Highly Tetrahedral, Diamond–Like Amorphous Hydrogenated Carbon Prepared from a Plasma Beam Source", Sattel et al., Published Feb. 1994, pp. 2797–2799.

(List continued on next page.)

Primary Examiner—Archene Turner
(74) Attorney, Agent, or Firm—Nixon & Vanderhye P.C.

(57) ABSTRACT

A substrate is coated with a solar management coating system including at least one infrared (IR) reflective layer. A diamond-like carbon (DLC) inclusive protective coating system (e.g., including at least one highly tetrahedral amorphous carbon (ta-C) inclusive layer having $sp^3$ carbon-carbon bonds) is provided on the substrate over at least the IR reflective layer in order to make the coating system scratch resistant, abrasion resistant, and generally mechanically durable. The DLC inclusive protective coating system may be hydrophobic, hydrophillic, or neutral in different embodiments of the invention. Optionally, at least one fluoro-alkyl silane (FAS) compound inclusive layer may be provided on the substrate over at least one of the DLC inclusive layer(s) in hydrophobic embodiments in order to increase contact angle θ of the coated article.

50 Claims, 11 Drawing Sheets

U.S. PATENT DOCUMENTS

| | | |
|---|---|---|
| 4,400,410 | 8/1983 | Green et al. |
| 4,495,263 | 1/1985 | Vandervalk |
| 4,504,519 | 3/1985 | Zelez |
| RE32,272 | 10/1986 | Funaki et al. |
| 4,666,802 | 5/1987 | Hung et al. |
| 4,746,538 | 5/1988 | Mackowski |
| 4,777,090 | 10/1988 | Ovshinsky et al. |
| 4,806,220 | 2/1989 | Finley |
| 4,816,291 | 3/1989 | Desphandey et al. |
| 4,877,677 | 10/1989 | Hirochi et al. |
| 4,898,789 | 2/1990 | Finley |
| 4,935,303 | 6/1990 | Ikoma et al. |
| 4,965,156 | 10/1990 | Hotaii et al. |
| 5,000,831 | 3/1991 | Osawa et al. |
| 5,028,759 | 7/1991 | Finley |
| 5,098,737 | 3/1992 | Collins et al. |
| 5,122,249 | 6/1992 | Niemann et al. |
| 5,135,808 | 8/1992 | Kimock et al. |
| 5,143,963 | 9/1992 | Sterling et al. |
| 5,188,887 | 2/1993 | Linge et al. |
| 5,190,807 | 3/1993 | Kimock et al. |
| 5,214,008 | 5/1993 | Beckwith et al. |
| 5,229,194 | 7/1993 | Lingle et al. |
| 5,240,886 | 8/1993 | Ghlotta et al. |
| 5,242,560 | 9/1993 | Lingle et al. |
| 5,250,322 | 10/1993 | Takahashi et al. |
| 5,268,217 | 12/1993 | Kimock et al. |
| 5,294,252 | 3/1994 | Gun |
| 5,298,048 | 3/1994 | Lingle et al. |
| 5,328,765 | 7/1994 | Goodwin |
| 5,344,718 | 9/1994 | Hartig et al. |
| 5,352,493 | 10/1994 | Dorfman et al. |
| 5,376,455 | 12/1994 | Hartig et al. |
| 5,378,527 | 1/1995 | Nakanishi et al. |
| 5,385,872 | 1/1995 | Gulotta et al. |
| 5,401,316 | 3/1995 | Shiraishi et al. |
| 5,415,297 | 5/1995 | Hirayama et al. |
| 5,415,927 | 5/1995 | Hirayama et al. |
| 5,419,969 | 5/1995 | Miyazaki et al. |
| 5,425,861 | 6/1995 | Hartig et al. |
| 5,425,983 | 6/1995 | Propst et al. |
| 5,435,900 | 7/1995 | Gorokhovsky |
| 5,437,894 | 8/1995 | Ogawa et al. |
| 5,455,081 | 10/1995 | Okada et al. |
| 5,470,661 | 11/1995 | Bailey et al. |
| 5,474,816 | 12/1995 | Falabella |
| 5,506,038 | 4/1996 | Knapp et al. |
| 5,507,987 | 4/1996 | Windischmann |
| 5,508,092 | 4/1996 | Kimock et al. |
| 5,508,368 | 4/1996 | Knapp et al. |
| 5,510,186 | 4/1996 | Suizbach |
| 5,514,476 | 5/1996 | Hartig et al. |
| 5,518,780 | 5/1996 | Tamor et al. |
| 5,527,559 | 6/1996 | Simpson |
| 5,527,596 | 6/1996 | Kimock et al. |
| 5,547,714 | 8/1996 | Huck et al. |
| 5,557,462 | 9/1996 | Hartig et al. |
| 5,580,605 | 12/1996 | Ogawa et al. |
| 5,612,262 | 3/1997 | Kloss et al. |
| 5,614,574 | 3/1997 | Sheth |
| 5,616,179 | 4/1997 | Baldwin et al. |
| 5,620,745 | 4/1997 | Simpson |
| 5,624,718 | 4/1997 | Dearnaley |
| 5,629,532 | 5/1997 | Myrick |
| 5,635,245 | 6/1997 | Kimock et al. |
| 5,635,258 | 6/1997 | Chen et al. |
| 5,637,353 | 6/1997 | Kimock et al. |
| 5,643,423 | 7/1997 | Kimock et al. |
| 5,653,812 | 8/1997 | Petrmichl et al. |
| 5,665,424 | 9/1997 | Sherman |
| 5,679,269 | 10/1997 | Cohen et al. |
| 5,679,446 | 10/1997 | Windischmann |
| 5,688,585 | 11/1997 | Lingle et al. |
| 5,688,864 | 11/1997 | Goodwin |
| 5,718,976 | 2/1998 | Dorfman et al. |
| 5,731,046 | 3/1998 | Mistry et al. |
| 5,736,476 | 4/1998 | Watzke et al. |
| 5,747,118 | 5/1998 | Bunshah et al. |
| 5,762,715 | 6/1998 | Paten, Jr. et al. |
| 5,763,064 | 6/1998 | Suzuki et al. |
| 5,770,321 | 6/1998 | Hartig et al. |
| 5,776,553 | 7/1998 | Jaffe et al. |
| 5,776,600 | 7/1998 | Katayama et al. |
| 5,776,603 | 7/1998 | Zagdoun et al. |
| 5,776,612 | 7/1998 | Fisher |
| 5,776,845 | 7/1998 | Boulos et al. |
| 5,776,846 | 7/1998 | Sakaguchi et al. |
| 5,783,260 | 7/1998 | Kato et al. |
| 5,783,309 | 7/1998 | Faure et al. |
| 5,792,254 | 8/1998 | Windischmann |
| 5,795,648 | 8/1998 | Goel et al. |
| 5,798,139 | 8/1998 | Nagashima et al. |
| 5,800,918 | 9/1998 | Chartier et al. |
| 5,800,933 | 9/1998 | Hartig et al. |
| 5,824,374 | 10/1998 | Bradley, Jr. et al. |
| 5,830,332 | 11/1998 | Babich et al. |
| 5,830,812 | 11/1998 | Shelestak et al. |
| 5,837,108 | 11/1998 | Lingle et al. |
| 5,837,357 | 11/1998 | Matsuo et al. |
| 5,844,225 | 12/1998 | Kimock et al. |
| 5,846,613 | 12/1998 | Neuville |
| 5,846,649 | 12/1998 | Knapp et al. |
| 5,849,228 | 12/1998 | Patton, Jr. et al. |
| 5,849,413 | 12/1998 | Zhu et al. |
| 5,851,940 | 12/1998 | Boulos et al. |
| 5,855,641 | 1/1999 | Taniguchi |
| 5,856,016 | 1/1999 | Takahashi et al. |
| 5,858,477 | 1/1999 | Verasamy et al. |
| 5,858,894 | 1/1999 | Nagashima et al. |
| 5,858,896 | 1/1999 | Nagashima et al. |
| 5,863,605 | 1/1999 | Bak-Boychuk et al. |
| 5,873,921 | 2/1999 | Hiroth et al. |
| 5,876,753 | 3/1999 | Timmons et al. |
| 5,877,103 | 3/1999 | Dupont et al. |
| 5,879,775 | 3/1999 | Walter et al. |
| 5,880,552 | 3/1999 | McGill et al. |
| 5,888,593 | 3/1999 | Petrmichl et al. |
| 5,900,342 | 5/1999 | Visser et al. |
| 5,902,505 | 5/1999 | Finley |
| 5,939,140 | 8/1999 | Jang et al. |
| 5,958,601 | 9/1999 | Salsman |
| 5,958,996 | 9/1999 | Egitto et al. |
| 5,965,216 | 10/1999 | Neuberger et al. |
| 5,965,629 | 10/1999 | Jung et al. |
| 5,976,683 | 11/1999 | Liehrr et al. |
| 5,989,693 | 11/1999 | Yamasaki et al. |
| 5,997,943 | 12/1999 | Azzopardi et al. |
| 6,001,431 | 12/1999 | Itoh et al. |
| 6,002,208 | 12/1999 | Maishev et al. |
| 6,046,758 | 4/2000 | Brown et al. |
| 6,261,693 | 7/2001 | Veerasamy |
| 6,280,834 | 8/2001 | Veerasamy et al. |
| 6,284,377 | 9/2001 | Veerasamy |
| 6,303,225 | 10/2001 | Veerasamy |
| 6,303,226 | 10/2001 | Veerasamy |
| 6,312,808 | 11/2001 | Veerasamy et al. |
| 6,335,086 | 1/2002 | Veerasamy |
| 6,338,901 | 1/2002 | Veerasamy |
| 2001/0028956 | 10/2001 | Veerasamy et al. |

OTHER PUBLICATIONS

"Deposition of Carbon Films by a Filtered Cathodic Arc", Kuhn et al., Jan. 1993, pp. 1350–1354.

"Electronic Density of States in Highly Tetrahedral Amorphous Carbon", Veerasamy et al., Aug. 1993, pp. 319–326.

"Preparation and Properties of Highly Tetrahedral Hydrogenated Amorphous Carbon", Weiler et al., Jan., 1996, pp. 1594–1607.

"Optical and Electronic Properties of Amorphous Diamond", Veerasamy et al., Feb. 1993, pp. 782–787.

"IBM Tech. Bulletin", vol. 36, No. 3 (1993) 1 pg, No month.

"IBM Tech. Bulletin", vol. 36, No. 1 (1993) 1 pg, No month.

"Tetrahedral Amorphous Carbon Deposition, Characterisation and Electrode Properties" by Veerasamy, Univ. of Cambridge, Jul., 1994.

"ANSI Z26.1", Society of Automotive Engineers, American National Standards Institute, Inc., 1977, No month.

"The Fracturing of Glass" by Michalske, et. al.

| Cycle # | Sputter time Seconds | Depth (SiO2) Å | Atomic Concentration % | | | SUM |
|---|---|---|---|---|---|---|
| | | | C | O | Si | |
| 1 | 0 | 0 | 92.5 | 5.7 | 1.7 | 100 |
| 2 | 16 | 6 | 96.4 | 1.8 | 1.9 | 100 |
| 3 | 32 | 12 | 96.2 | 1.9 | 1.9 | 100 |
| 4 | 62 | 23 | 95.8 | 1.4 | 2.8 | 100 |
| 5 | 92 | 34 | 95.9 | 1.2 | 2.9 | 100 |
| 6 | 122 | 45 | 94.7 | 1.7 | 3.6 | 100 |
| 7 | 222 | 82 | 89.6 | 2.7 | 7.7 | 100 |
| 8 | 322 | 119 | 83.1 | 3.3 | 13.6 | 100 |
| 9 | 422 | 156 | 76.6 | 4.4 | 19.0 | 100 |
| 10 | 522 | 193 | 70.5 | 4.4 | 25.2 | 100 |
| 11 | 622 | 230 | 68.1 | 4.7 | 27.2 | 100 |
| 12 | 722 | 267 | 66.8 | 4.7 | 28.5 | 100 |
| 13 | 822 | 304 | 62.5 | 7.1 | 30.5 | 100 |
| 14 | 922 | 341 | 45.1 | 23.1 | 31.7 | 100 |
| 15 | 1022 | 378 | 11.1 | 54.0 | 34.9 | 100 |
| 16 | 1122 | 415 | 0 | 65.9 | 34.1 | 100 |
| 17 | 1222 | 452 | 0 | 66.1 | 33.9 | 100 |
| 18 | 1322 | 489 | 0 | 65.9 | 34.1 | 100 |
| 19 | 1422 | 526 | 0 | 66.1 | 33.9 | 100 |

FIG. 8

| Cycle # | Sputter time Seconds | Depth (SiO2) Å | Atomic Concentration % | | | SUM |
|---|---|---|---|---|---|---|
| | | | C | O | Si | |
| 1 | 0 | 0 | 72.2 | 17.7 | 10.0 | 100 |
| 2 | 16 | 8 | 83.1 | 7.2 | 9.7 | 100 |
| 3 | 32 | 15 | 82.3 | 4.1 | 13.5 | 100 |
| 4 | 48 | 23 | 81.2 | 4.9 | 13.9 | 100 |
| 5 | 64 | 31 | 79.4 | 5.2 | 15.4 | 100 |
| 6 | 80 | 38 | 75.9 | 5.6 | 18.5 | 100 |
| 7 | 96 | 46 | 74.0 | 8.5 | 17.4 | 100 |
| 8 | 112 | 54 | 68.9 | 10.8 | 20.2 | 100 |
| 9 | 128 | 61 | 64.2 | 13.9 | 22.0 | 100 |
| 10 | 144 | 69 | 58.7 | 17.8 | 23.5 | 100 |
| 11 | 160 | 77 | 49.4 | 23.2 | 27.4 | 100 |

FIG. 9

SOLAR MANAGEMENT COATING SYSTEM INCLUDING PROTECTIVE DLC

This is a continuation-in-part (CIP) U.S. patent application Ser. No. 09/698,126, filed Oct. 30, 2000, entitled "Low-E Coating System Including Protective DLC", and a CIP of U.S. patent application Ser. No. 09/303,548, filed May 3, 1999 (now U.S. Pat. No. 6,261,693), and a continuation-in-part (CIP) of U.S. patent application Ser. No. 09/442,805, filed Nov. 18, 1999 (now U.S. Pat. No. 6,338,901), and a continuation-in-part (CIP) of U.S. patent application Ser. No. 09/583,862 filed Jun. 1, 2000, entitled "Hydrophobic Coating Including DLC on Substrate" (now U.S. Pat. No. 6,335,086), and a CIP of U.S. patent application Ser. No. 09/617,815, filed Jul. 17, 2000, entitled "Hydrophobic Coating with DLC & FAS on Substrate" (now U.S. Pat. No. 6,312,808), the disclosures of which are all hereby incorporated herein by reference.

This invention relates to a solar management coating system including diamond-like carbon (DLC), the system being provided on (directly or indirectly) a substrate of glass, plastic, ceramic, or the like, and a method of making the same.

BACKGROUND OF THE INVENTION

Sputter coated systems for deposition on glass are known in the art for achieving solar management properties (e.g., infrared reflectance) in glass articles such as insulating glass (IG) windows, vehicle windows, architectural windows, and the like. In many such coating systems, it is desirable to provide a coating system capable of: (i) reflecting a certain amount of infrared (IR) radiation, while (ii) allowing an acceptable amount of visible light transmittance, and (iii) limiting the amount of visible light reflectance off of the coating system.

Exemplary solar management coating systems capable of reflecting infrared (IR) radiation are disclosed in U.S. Pat. Nos. 5,229,194 and 5,837,108, the disclosures of which are both hereby incorporated herein by reference.

Unfortunately, many conventional solar management coating systems are prone to scratching. Thus, they are not as abrasion resistant as would be desired.

U.S. Pat. No. 5,976,683 discloses a low-E coating system having high transmissivity in the visible spectrum and high reflectivity in the thermal radiation spectrum. A polycrystalline carbon layer crystallized with a diamond structure and doped with foreign atoms is provided and formed via CVD. Unfortunately, such polycrystalline layers are difficult and expensive to deposit on substrates and typically require very high temperatures during the deposition process (e.g., from 700 to 1,000 degrees C.). If one attempted to elevate a substrate including a low-E coating system thereon to such temperatures, many such low-E systems would be destroyed or significantly damaged. Thus, the use of a "polycrystalline" diamond layer formed in such a manner over a such a system is neither practical nor desirable.

U.S. Pat. No. 5,837,108 (incorporated herein by reference) discloses a solar management coating system including, on a substrate from the substrate outwardly, a silicon nitride layer, a nickel or nickel alloy layer, and another silicon nitride layer. Unfortunately, it has been found that the solar management coating system of the '108 patent may be susceptible to scratching in certain types of environments.

In view of the above, it will be apparent to those skilled in the art that there exists a need in the art for an improved scratch resistant and/or mechanically durable solar management coating system for use in automotive and/or architectural window applications. There also exists a need in the art for a solar management coating system that can repel water and/or dirt, and a method of making the same. There also exists a need in the art for a solar management coating system including a protective layer(s) system that can be deposited over underlying IR reflecting layer(s) via a low temperature process.

It is a purpose of different embodiments of this invention to fulfill any or all of the above described needs in the art, and/or other needs which will become apparent to the skilled artisan once given the following disclosure.

SUMMARY OF THE INVENTION

An object of this invention is to provide a solar management coating system that is scratch resistant and mechanically durable.

Another object of this invention is to provide a diamond-like carbon (DLC) inclusive protective layer(s) or coating system located over a solar management arrangement, wherein the DLC inclusive protective layer(s) or coating system can be deposited in or via a low temperature process so as to not significantly damage the existing or underlying solar management layer arrangement.

Another object of this invention is to provide a solar management coating system that is (i) scratch resistant and mechanically durable, (ii) capable of reflecting an acceptable amount of infrared (IR) radiation, (iii) capable of allowing an acceptable amount of visible light transmittance if desired, and (iv) capable of limiting the amount of visible light reflectance off of the coating system if desired.

While non-hydrophobic solar management coating systems are often desirable, there also sometimes exists a need for a solar management coating system that may be hydrophobic (i.e., can shed or repel water) if desired. Thus, another object of this invention is to provide solar management coating systems that are hydrophobic, as well as solar management coating systems that need not be hydrophobic.

Another object of this invention is to provide a scratch resistant solar management coating system including at least one diamond-like carbon (DLC) inclusive layer having at least some highly tetrahedral amorphous carbon (ta-C), wherein the ta-C includes $sp^3$ carbon-carbon bonds so as to make the layer more scratch resistant and mechanically durable.

In certain embodiments, a solar management coating system may include each of a DLC inclusive layer(s) and a fluoro-alkyl silane (FAS) compound inclusive layer, wherein the DLC is provided for durability purposes and the FAS for increasing the contact angle $\theta$ of the coating system.

Another object of certain embodiments of this invention is to provide a solar management coating system including $sp^3$ carbon-carbon bonds and FAS, the solar management coating system having a wettability W with regard to water of less than or equal to about 23 mN/m, more preferably less than or equal to about 21 mN/m, even more preferably less than or equal to about 20 mN/m, and in most preferred embodiments less than or equal to about 19 mN/meter. This can also be explained or measured in Joules per unit area $(mJ/m^2)$ Another object of this invention is to provide a solar management coating system having a surface energy $\gamma_c$ (on the surface of the coated article) of less than or equal to about 20.2 mN/m, more preferably less than or equal to about 19.5 mN/m, and most preferably less than or equal to about 18 mN/m.

Another object of this invention is to provide a solar management coating system having an initial (i.e. prior to being exposed to environmental tests, rubbing tests, acid tests, UV tests, or the like) water contact angle θ of at least about 55 degrees, more preferably of at least about 80 degrees, still more preferably of at least about 100 degrees, even more preferably of at least about 110 degrees, and most preferably of at least about 125 degrees.

Another object of this invention is to manufacture a solar management coating system including at least one DLC inclusive layer, wherein the DLC inclusive layer is deposited in a manner such that during the DLC deposition process the underlying substrate and/or IR reflecting layer (e.g., Ag, Ni, or NiCr layer) may be kept at temperature(s) no greater than about 200° C., preferably no greater than about 150° C., most preferably no greater than about 80° C.

Yet another object of this invention is to fulfill any and/or all of the aforesaid objects and/or needs.

In certain embodiments of this invention, the resulting coated article with the solar management coating system thereon may be heat treated (e.g., tempered, annealed, bent, etc.), while in other embodiments of this invention the resulting coated article need not be heat treated.

This invention will now be described with respect to certain embodiments thereof, along with reference to the accompanying illustrations.

IN THE DRAWINGS

FIG. 2($b$) is a side cross sectional view of a coated article according to another embodiment of this invention, wherein a substrate is provided with a solar management coating system thereon including a pair of protective DLC inclusive layers.

FIG. 4($b$) is a side cross sectional partially schematic view illustrating the coated article of any of the FIGS. 1–3 embodiments (if and when a hydrophobic system is desired) of this invention and the contact angle θ of a water drop thereon.

FIG. 8 is a chart illustrating the atomic amounts of carbon, oxygen, and silicon (relative only to one another) at different thicknesses of the two DLC inclusive layers of the FIG. 2 coating system (i.e., without an overlying FAS inclusive layer).

FIG. 9 is a chart illustrating the atomic amounts of carbon, oxygen, and silicon (relative only to one another) at different thicknesses of the FAS portion of a sample coating system in accordance with the FIG. 2($a$) embodiment of this invention; so FIGS. 8–9 can be used together to illustrate a complete coating system including both DLC and FAS inclusive layers of the FIG. 2($a$) embodiment.

DETAILED DESCRIPTION OF CERTAIN EMBODIMENTS OF THIS INVENTION

Figure 1:
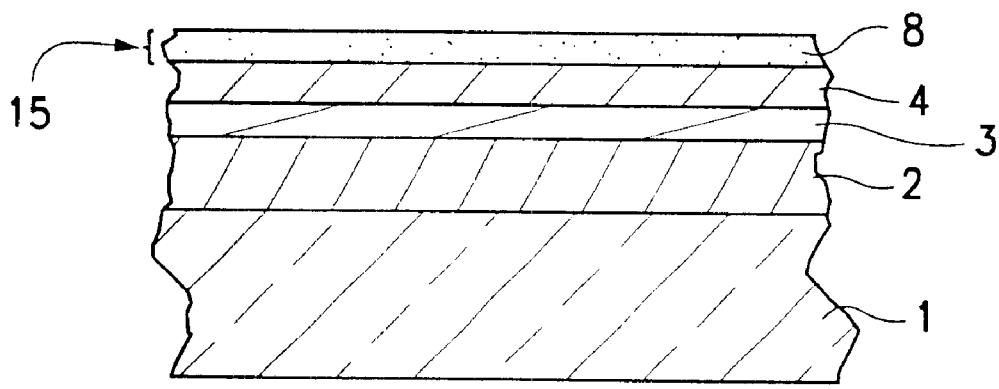
FIG. 1 is a side cross sectional view of a coated article according to an embodiment of this invention, wherein a substrate is provided with a solar management coating system thereon including a DLC inclusive protective layer.

Referring now more particularly to the accompanying drawings in which like reference numerals indicate like elements throughout the accompanying views.

FIG. 1 is a side cross sectional view of a substrate provided with a solar management coating system thereon according to an embodiment of this invention. The product includes underlying substrate 1 of glass, ceramic or plastic (preferably soda-lime-silica float glass from about 1.5 to 6 mm thick), substantially transparent dielectric layer 2 (e.g., of or including silicon nitride (e.g., $Si_3N_4$), silicon oxynitride, $SiO_2$, $TiO_2$, PbO, $Bi_2O_3$, or any mixture thereof), infrared (IR) reflecting layer 3 (e.g. of or including Ni, NiCr, Cr, Ag, or any other suitable IR reflecting material), substantially transparent dielectric layer 4 (e.g., of or including silicon nitride (e.g., $Si_3N_4$), silicon oxynitride, $SiO_2$, $TiO_2$, PbO, $Bi_2O_3$, or any mixture thereof), and diamond-like carbon (DLC) inclusive layer 8. In an exemplary preferred embodiment layer 2 is of or includes silicon nitride, layer 3 is of or includes Ni or NiCr, layer 4 is of or includes silicon nitride, and layer 8 is of or includes DLC. Layer 2 may or may not function as an anti-reflective layer for reducing visible light reflections on the glass side in different embodiments of this invention.

In an exemplary embodiment, the solar management coating system includes, from substrate 1 outwardly, silicon nitride layer 2 from about 5–70 angstroms (Å) thick (more preferably from about 35–50 Å thick), IR reflecting Ni or NiCr (e.g., 80/20 Ni/Cr by weight or any other suitable ratio) layer 3 from about 30–150 Å thick (more preferably from about 50–100 Å thick), silicon nitride layer 4 from about 200–500 Å thick (more preferably from about 300–400 Å thick), DLC inclusive layer(s) 8 as described in any embodiment of either of parent applications ser. No. 09/303,548 or 09/442,805. For example, DLC inclusive layer 8 may be from about 10 to 250 angstroms (Å) thick, or any other thickness discussed in any of the parent applications, in different embodiments of this invention. Optionally, each of layers 2 and 4 may include from about 0–6% stainless steel and/or aluminum (more preferably from about 0–2% stainless steel and/or aluminum) in certain embodiments.

In certain embodiments of this invention, layer 3 functions to reflect IR radiation and optionally may be designed to reflect visible light, reduce solar energy transmission, and/or resist a significant amount of high temperature oxidation during heat treatment. Meanwhile, layer 2 promotes adhesion between substrate 1 and IR reflecting layer 3, reduces Na or other types of migration from the substrate 1 when the substrate is of glass, and may or may not function in an anti-reflective manner. Layer 4 increases the chemical resistance and/or mechanical durability of the system and functions to promote adhesion of DLC inclusive layer 8 to layer 3. For example, it has been found that the Si in layer 4 (e.g., of or including silicon nitride, silicon oxide and/or silicon oxynitride in exemplary embodiments) enables DLC inclusive layer 8 to bond thereto in a strong manner so that adhesion of layer 8 to the system is good. It is noted that other layers may be provided either between layer 2 and substrate 1, and/or between layer 8 and layer 4 in different embodiments of this invention, or at any other suitable location depending upon the desired application.

DLC inclusive layer 8 is preferably substantially non-polymerized and substantially non-crystalline and makes up (either alone or in combination with another layer(s)) a protective DLC inclusive layer(s) or coating system 15 that is mechanically and chemically durable, scratch resistant, and protects the underlying portion (e.g., solar management arrangement of layers 2–4) of the solar management coating system. Thus, system 15 provides durability enhancement (e.g., scratch resistance) to the solar management coating system, while not substantially adversely affecting the solar management characteristics of the coating system. As will be further explained below, protective coating system 15 may be a hydrophobic coating system in certain embodiments of this invention when hydrophobic properties are desired, but need not be hydrophobic in other embodiments.

An advantage associated with certain embodiments of this invention is that DLC inclusive protective system 15 can be deposited or formed over solar management layer arrangement 2–4 via a low temperature deposition process (e.g., ion beam deposition as described below). For example, protective layer(s) system 15 can be deposited at temperatures no greater than about 200 degrees C., more preferably no greater than about 125 degree C., even more preferably at temperatures no greater than about 75 degree C., and most preferably at temperatures no greater than about 40 degree C. (e.g., layer system 15 may be deposited at approximate room temperature in certain embodiments). These low temperatures are compared to the 700–1,000 degree C. temperatures typically required for depositing the non-amorphous polycrystalline diamond in the aforesaid '683 patent. As a result of the low temperatures used during the system 15 deposition process, the underlying layers 2–4 are prevented from being prematurely heated prior to an eventual heat treatment in some embodiments, or alternatively layers 2–4 may be prevented from being damaged in other embodiments. Moreover, the amorphous DLC in layer 8 provides excellent durability and scratch resistance, and may be substantially transparent to visible light in certain embodiments. As discussed above, the resulting coated article shown in FIG. 1 may be heat treated (e.g., annealed, tempered, bent, etc.) in certain embodiments, but need not be heat treated in other embodiments of this invention.

In the FIG. 1 embodiment, DLC inclusive layer 8 may be made up of or include any of the DLC inclusive layers described and/or illustrated in the parent commonly owned U.S. Ser. No. 09/303,548, filed May 3, 1999, which is incorporated herein by reference, or the parent commonly owned U.S. Ser. No. 09/442,805, filed Nov. 18, 1999, incorporated herein by reference. Thus, DLC inclusive layer 8 preferably includes at least some amount of highly tetrahedral amorphous carbon (ta-C). Highly tetrahedral amorphous carbon (ta-C) forms $sp^3$ carbon-carbon bonds, and is a special form of diamond-like carbon (DLC). In certain embodiments of this invention, in DLC inclusive layer 8 at least about 40% (more preferably at least about 60%, and most preferably at least about 80%) of the carbon-carbon bonds are of the $sp^3$ carbon-carbon type. The remainder of the bonds in layer 8 may be, for example, $sp^2$ carbon-carbon bonds, Si—C bonds, C—O bonds, or the like. This enables layer 3 to bond well to the Si-inclusive layer 4 (e.g., of silicon nitride). Moreover, the provision of at least some $sp^3$ carbon-carbon bonds in layer 8 enables layer 8 to be more scratch resistant, hard, chemically resistant and substantially transparent. Layer 8, in certain embodiments, has a hardness of at least about 10 GPa, more preferably from about 25–80 GPa, due in large part to the presence of the $sp^3$ carbon-carbon bonds.

The layers 2–4 of the solar management arrangement may be made up of or include any of the coating systems disclosed and/or described in any of U.S. Pat. No. 5,837,108, incorporated herein by reference. Alternatively, any other suitable solar management arrangement with a Si inclusive top layer may instead be used beneath the protective DLC inclusive layer system 15. Exemplary thicknesses of layers 2–4 are provided in the '108 patent, as are exemplary materials which may be used for these layers and exemplary methods of manufacturing same via sputtering. An exemplary solar management arrangement including layers 2–4 is any of those sold under the tradename "Sunguard" by Guardian Industries Corp., Auburn Hills, Mich.

Solar management characteristics of the solar management coating system of this invention are also provided in the '108 patent (the presence of substantially transparent protective system 15 does not substantially adversely affect the solar management characteristics of the underlying arrangement of layers 2–4). For example, coated articles herein (before and/or after heat treatment which is optional) preferably have a normal emissivity ($E_n$) of about 1.0 or less (more preferably from about 0.1 to 0.75), a hemispherical emissivity ($E_h$) of about 1.0 or less (more preferably from about 0.1 to 0.75), and arrangement 2–4 may have a sheet resistance ($R_s$) of from about 10 to 500 ohms/square or less (more preferably from about 20 to 300 ohms/square or less). Coated articles herein may have any suitable visible transmittance, but in certain embodiments may have a visible transmittance of from about 10–80%, more preferably from about 60–80%. Layers 2–4 may be deposited on substrate 1, preferably by sputtering, via any of the techniques discussed in the '108 patent, or using any other suitable technique in different embodiments of this invention. Moreover, solar management arrangement of layers 2–4 and/or IR reflecting layer 3 may have the IR reflectance characteristics explained in U.S. Pat. No. 5,837,108, incorporated herein by reference.

Figure 2A:
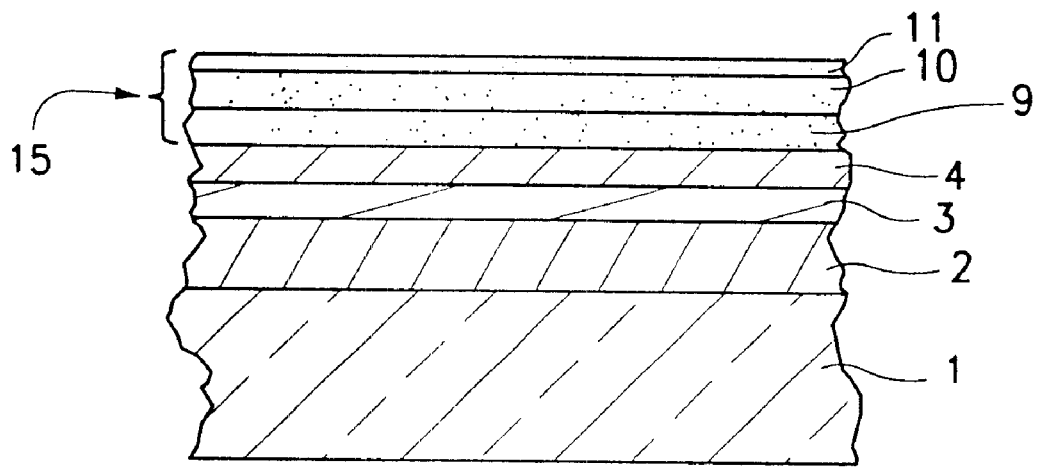
FIG. 2($a$) is a side cross sectional view of a coated article according to another embodiment of this invention, wherein a substrate is provided with a solar management coating system thereon including a pair of DLC inclusive protective layers and a FAS compound inclusive layer.

FIG. 2(*a*) is a side cross sectional view of a coated article including a solar management coating system according to an embodiment of this invention, wherein a diamond-like carbon (DLC) and fluoro-alkyl silane (FAS) inclusive protective coating system 15 including at least three layers 9, 10 and 11 is provided on substrate 1 over the same solar management layers 2–4 described above and illustrated in FIG. 1. Referring to the FIG. 2(a) embodiment, substrate 1 may be of glass, plastic, ceramic, or the like. In certain embodiments, each of layers 9 and 10 of the protective coating system 15 portion of the solar management system includes at least some amount of highly tetrahedral amorphous carbon (ta-C). As mentioned above, highly tetrahedral amorphous carbon (ta-C) forms $sp^3$ carbon-carbon bonds, and is a special form of diamond-like carbon (DLC). DLC inclusive layers 9 and 10 are preferably substantially non-crystalline and/or substantially non-polymerized in certain embodiments of this invention. FAS inclusive layer 11 is then applied over layers 9, 10. Protective system 15 (to be deposited at the low temperatures described above) may function in a hydrophobic manner (i.e., it is characterized by high water contact angles θ and/or low surface energies as described below), and optionally may be characterized by low tilt angle(s) β in certain embodiments. In general, the DLC inclusive layer(s) 9 and/or 10 provide durability, scratch resistance and/or hydrophobicity, while FAS inclusive layer 11 functions to even further increase the contact angle θ of the protective coating system 15 if desired.

In the FIG. 2 embodiment(s), DLC inclusive coating/layer system 15 may comprise any of the DLC inclusive layer systems illustrated and/or described in one or both of parent applications Ser. Nos. 09/583,862 and/or 09/303,548, both of which are incorporated herein by reference.

It is surmised that the surface of DLC inclusive layer 10 includes highly reactive dangling bonds immediately after its formation/deposition, and that the application of FAS inclusive layer 11 onto the surface of layer 10 shortly after layer 10's formation enables tight binding and/or anchoring of FAS inclusive layer 11 to the surface of layer 10. This results in increased contact angle θ (improved hydrophobicity) and a durable coating system. In certain embodiments of this invention, it has been found that FAS inclusive layer 11 bonds more completely to DLC inclusive layer 10 when FAS layer 11 is applied on the upper surface of layer 10 within one hour after layer 10 is formed, more preferably within thirty minutes after layer 10 is formed, and most preferably within twenty minutes after layer 10 is formed. Thus, a more durable coating system results when FAS inclusive layer 11 is applied on DLC inclusive layer 10 shortly after layer 10 is formed.

Overlying layer 11 may be substantially all FAS, or only partially FAS in different embodiments of this invention. Layer 11 preferably includes at least one compound having an FAS group. Generally speaking, FAS compounds generally comprise silicon atoms bonded to four chemical groups. One or more (e.g., one through four) of these groups contains fluorine and carbon atoms (e.g., $CH_3$) and the remaining group(s) attached to the silicon atoms are typically alkyl (hydrocarbon), alkoxy (hydrocarbon attached to oxygen), or halide (e.g., chlorine) group(s). Exemplary types of FAS for use in layer 11 include $CF_3(CH_2)_2Si(OCH_3)_3$ [i.e., 3,3,3 trifluoropropyl)trimethoxysilane]; $CF_3(CF_2)_5(CH_2)_2Si(OCH_2CH_3)_3$ [i.e., tridecafluoro-1,1,2,2-tetrahydrooctyl-1-triethoxysilane]; $CF_3(CH_2)_2SiCl_3$; $CF_3(CF_2)_5(CH_2)_2SiCl_3$; $CF_3(CF_2)_7(CH_2)_2Si(OCH_3)_3$; $CF_3(CF_2)_5(CH_2)_2Si(OCH_3)_3$; $CF_3(CF_2)_7(CH_2)_2SiCl_3$; $CF_3(CF_2)_7(CH_2)_2SiCH_3Cl_2$; and/or $CF_3(CF_2)_7(CH_2)_2SiCH_3(OCH_3)_2$. These FAS material may be used either alone or in any suitable combination for layer 11. At least partial hydrolysate (hydrolysed) versions of any of these compounds may also be used. Moreover, it is noted that this list of exemplary FAS materials is not intended to be limiting, as other FAS type materials may also be used in layer 11. While FAS inclusive layer 11 is applied over layer 10 by physical rubbing (or buffing) in certain preferred embodiments of this invention, layer 11 could instead be applied in any other suitable manner in other embodiments of this invention. It certain embodiments, FAS inclusive layer 11 may be thermally cured as described below relative to FIG. 10.

Still referring to FIG. 2(a), according to certain embodiments of this invention, while DLC inclusive layers 9 and 10 each include DLC, the two layers are preferably deposited using different precursor or feedstock gases so that the two layers have different characteristics (e.g., different hardnesses and/or densities). In an exemplary embodiment, underlying or anchor DLC inclusive layer 9 is deposited using an ion beam deposition technique utilizing a TMS (tetramethylsilane) inclusive precursor or feedstock gas; while overlying DLC inclusive layer 10 is deposited using an ion beam deposition technique utilizing a $C_2H_2$ (acetylene) inclusive precursor or feedstock gas. It is believed that the underlying layer 9 (e.g., a silicon doped DLC alloy) deposited using TMS functions as a barrier layer to prevent certain impurities from getting into or out of the substrate. Moreover, when TMS is used in the deposition process of underlying anchor layer 9, the Si (silicon) in layer 9 helps to enable overlying DLC inclusive layer 10 to better bond and/or adhere to layer arrangement 2–4 via anchor layer 9, and helps to enable layers 9–10 or 9–11 to better bond and/or adhere to Si inclusive layer 4.

Surprisingly, it has also been found that the use of anchor DLC inclusive layer 9 (e.g., deposited via TMS gas) provides a more continuous/contiguous coating on a substrate surface at very thin thicknesses as compared to a DLC inclusive layer deposited using $C_2H_2$ (acetylene) gas directly on glass. As a result, anchor layer 9 (which is optional herein, but preferred in certain embodiments) can be deposited first directly on layer 4 at a relatively thin thickness, and the overlying layer 10 need not be as thick as would otherwise be required. In general, the thinner the layer 10, the higher the transmission of the overall coating system. Moreover, the provision of anchor layer 9 may enable improved yields to be achieved, as the occurrence of pinholes in the protective coating system 15 is less likely.

Still referring to the FIG. 2(a) embodiment, in embodiments where DLC inclusive layer 10 is formed on the substrate using a $C_2H_2$ (acetylene) inclusive precursor or feedstock gas and underlying DLC inclusive layer 9 is formed on the substrate (over layers 2–4) using at least a TMS (tetramethylsilane) inclusive precursor or feedstock gas, the layers 9 and 10 tend to intermix with one another during the deposition process. Thus, there may not be a clear line delineating or separating the two layers 9 and 10 in the final product due to this intermixing (i.e., ion mixing) of the material from the two layers. However, for purposes of simplicity, the two layers 9 and 10 are referred to and illustrated herein as separate layers due to the different deposition processes (e.g., gases and/or energies) used in their respective formations.

It has been found that the outer DLC inclusive layer 10 formed using a hydrocarbon gas, such as $C_2H_2$ (acetylene), inclusive precursor or feedstock tends to have a greater hardness and density than does underlying DLC inclusive layer 9 formed using a TMS (tetramethylsilane) (or other Si inclusive) inclusive precursor or feedstock gas. For example, in certain exemplary embodiments of this invention, overlying layer 10 may have an average hardness (measured via a nano-indentation hardness measuring technique) of from about 45–85 GPa, more preferably from about 50–70 GPa, and most preferably from about 55–60 GPa. Meanwhile, underlying DLC inclusive layer 9 may have an average hardness of from about 10–35 GPa, and more preferably from about 15–30 GPa. Thus, the overlying layer 10 may be harder than the underlying layer 9 in certain embodiments, so as to make the end product more scratch and/or abrasion resistant. Using a nano-indentation hardness measuring technique, the final protective coating system 15, including layers 9–11, may have a hardness of at least about 10 GPa, more preferably from about 25–60 GPa, and even more preferably from about 30–45 GPa, which is at a hardness value between the respective hardnesses of the two DLC inclusive layers 9 and 10.

Thus, protective coating system 15 includes silicon (Si) in DLC inclusive layer 9 which functions to improve the bonding characteristics of overlying and harder DLC inclusive layer 10 to the underlying solar management system (e.g., via layer 4). For example, when layer 4 includes silicon nitride, the silicon (Si) in layer 9 enables excellent bonding of the DLC inclusive protective layer system 15 to the underlying solar management arrangement including layers 2–4. While the Si in layer 9 improves the bonding of layer 10 to the underlying substrate 1 (or layer 4), it is preferred that less Si be provided in layer 10 than in layer 9 because the provision of Si in a DLC inclusive layer may result in decreased scratch resistance and/or decreased hardness. Layer 10 may or may not include Si in different embodiments of this invention. While layer 9 allows for improved bonding to the substrate and underlying solar management arrangement of layers 2–4, the provision of DLC and some $sp^3$ carbon-carbon bonds therein allows this anchor layer 9 to have rather high hardness values so as to render the resulting product more durable and thus resistant to scratching, abrasions, chemicals, and the like.

In the FIG. 2(*a*) embodiment, anchor or intermediate DLC inclusive layer 9 may be from about 10 to 250 angstroms (Å) thick, more preferably from about 10 to 150 angstroms thick, and most preferably from about 30–50 angstroms thick; while outer DLC inclusive layer 10 may be from about 10 to 250 angstroms thick, more preferably from about 10 to 150 angstroms thick, and most preferably about 30–60 angstroms (Å) thick. FAS inclusive layer 11 may be from about 5–80 angstroms thick, more preferably from about 20–50 angstroms thick. However, these thicknesses are not limiting and the layers may be of other appropriate thicknesses in certain embodiments of this invention.

In certain embodiments, layer 10 may have an approximately uniform distribution of $sp^3$ carbon-carbon bonds throughout a large portion of its thickness, so that much of the layer has approximately the same density. However, in some embodiments layer 9 may include a lesser percentage of $sp^3$ carbon-carbon bonds near the interface with substrate 1, with the percentage or ratio of $sp^3$ carbon-carbon bonds increasing throughout the thickness of the coating system 15 toward the outermost surface of layer 10. In overlying DLC inclusive layer 10, at least about 40% (more preferably at least about 60%, and most preferably at least about 80%) of the carbon-carbon bonds in the layer are of the $sp^3$ carbon-carbon type.

It is believed that the presence of $sp^3$ carbon-carbon bonds in layer 10 increases the density and hardness of the coating system, thereby enabling it to satisfactorily function in automotive environments. Layer 10 may or may not include $sp^2$ carbon-carbon bonds in different embodiments, although formation of $sp^2$ carbon-carbon bonds is likely in both layers 9 and 10.

Protective DLC inclusive layer system 15 may be hydrophobic in certain embodiments of this invention, hydrophillic in other embodiments of this invention, and/or neutral (neither hydrophobic nor hydrophillic) in other embodiments of this invention, depending upon the desired application. When it is desired to provide a hydrophobic coating system, in order to improve the hydrophobic nature of coating system 15 atoms in addition to carbon (C) may be provided in at least overlying layer 10 in different amounts in different embodiments. For example, in certain embodiments of this invention, layer 10 (taking the entire layer thickness, or only a thin 10 Å thick layer portion thereof into consideration) may include in addition to the carbon atoms of the $sp^3$ carbon-carbon bonds, by atomic percentage, from about 0–20% Si (more preferably from about 0–10%), from about 0–20% oxygen (O) (more preferably from about 0–15%), and from about 5–60% hydrogen (H) (more preferably from about 5–35% H). Optionally, layer 10 may include from about 0–10% (atomic percentage) fluorine (F) (more preferably from about 0–5% F) in order to further enhance hydrophobic characteristics of the coating (especially in the FIGS. 2(*b*) and 3 embodiments). In general, the provision of H in layer 10 reduces the number of polar bonds at the coating's surface, thereby improving the coating system's hydrophobic properties.

In certain embodiments, the outermost layer portion (e.g., 5–15 angstrom thick outermost or exterior layer portion) of layer 10 may include additional H and/or F atoms for the purpose of increasing the coating system's hydrophobic qualities (especially in the FIGS. 2(*b*) and 3 embodiments). In such embodiments, the deposition of additional H atoms near layer 10's surface results in a more passive or non-polar coating proximate the surface thereof.

Two exemplary protective DLC inclusive hydrophobic coating systems 15 on a glass substrate (absent layers 2–4) were made and tested according to the FIG. 2(*a*) embodiment of this invention, as follows.

For the first coated article (sample #1), DLC inclusive layers 9 and 10 were deposited on a soda-lime-silica glass substrate 1 using a linear ion beam deposition source (see FIGS. 5–6) in the following manner. TMS feedstock gas (50 sccm) was used at 1,500 Volts to deposit layer 9, while $C_2H_2$ feedstock gas (100 sccm) was used at 3,000 Volts to deposit layer 10 directly on top of layer 9. The underlying substrate was maintained at about 70 to 80 degrees F. during the deposition process. The scan speed for each of these was 36–50 in./minute. Each of layers 9 and 10 was less than 50 angstroms thick (likely from about 20–50 angstroms thick). Sample #2 was made in the same manner as sample #1, except that 750 Volts were used in depositing layer 9 (the same 3,000 Volts were used for layer 10). Chart 1 below lists the measured characteristics of the substrates 1 coated with layers 9 and 10, prior to deposition of FAS layer 11, for sample #s 1 and 2 of the FIG. 2(*a*) embodiment (absent layers 2–4).

CHART 1

| Initial Contact Angle θ | Angle θ @ 25 Taber Cycles | @ 300 | @ 1,000 |
|---|---|---|---|
| #1 95° | 104° | 103° | 97° |
| #2 95° | 104° | N/A | 96° |

As can be seen in Chart 1 above, each of these coated articles (substrate with DLC inclusive layers 9 and 10 thereon, but no FAS layer) had an initial contact angle θ of about 95 degrees. After being subjected to 25 cycles of a Taber abrasion test, each had a contact angle of about 104 degrees, and after being subject to 1,000 cycles of the Taber abrasion test the articles had contact angles of 97 and 96 degrees, respectively.

An FAS inclusive layer 11 was then deposited on top of a layer 10 as shown in the FIG. 2(a) embodiment of this invention. Layer 11 was applied by physically rubbing it onto the exterior surface of layer 10. The measurements from this coated article (i.e., sample #3 including each of layers 9, 10 and 11 on soda-lime-silica glass substrate 1) are set forth below in Chart 2.

CHART 2

|  | Initial Contact Angle θ | Angle θ@ 25 Taber Cycles | @ 300 | @ 1,000 |
|---|---|---|---|---|
| #3 | 109° | 106° | 100° | 95° |

As can be seen by comparing the results in Chart 2 (with optional FAS layer 11) to the results of Chart 1 (without FAS layer 11), the provision of FAS layer 11 improved at least the initial contact angle of the resulting coated article. Charts 1 and 2 show that the addition of FAS layer 11 resulted in the initial contact angle improving from about 95 degrees to about 109 degrees. Thus, hydrophobic properties of the article were improved with the addition of FAS inclusive layer 11.

In certain embodiments of this invention (in both FAS and non-FAS embodiments), after 300 taber cycles the contact angle is preferably at least about 90 degrees, more preferably at least about 95 degrees. In a similar manner, after 1,000 tabler cycles the contact angle is preferably at least about 80 degrees, more preferably at least about 90 degrees.

Figure 2B:
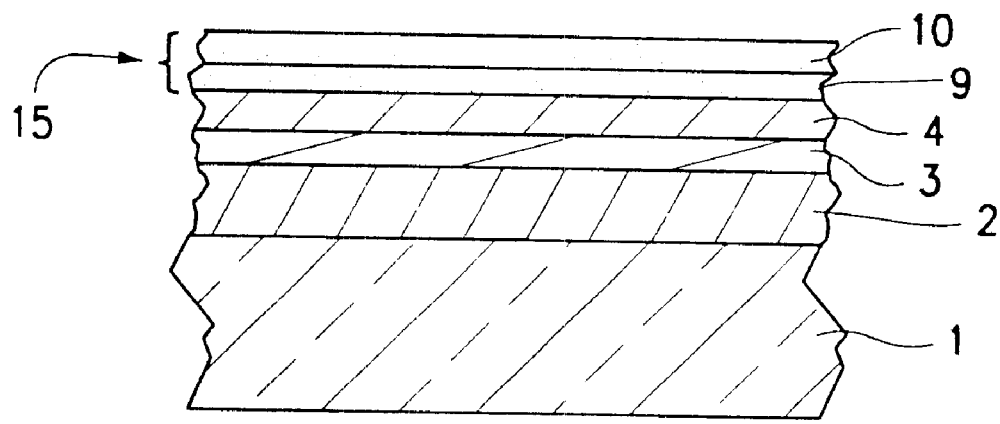

FIG. 2(b) illustrates another embodiment of this invention, which is the same as the FIG. 2(a) embodiment except that FAS inclusive layer 11 is not provided. Thus, FAS inclusive layer 11 is clearly optional. In this FIG. 2(b) embodiment, the provision of DLC inclusive layers 9 and/or 10 to make up DLC inclusive protective layer system 15 enables the underlying solar management arrangement of layers 2–4 to be protected against scratching, abrasions, etc. Still further, the protective layer system 15 according to this embodiment may or may not be hydrophobic in different embodiments of this invention.

Figure 3:
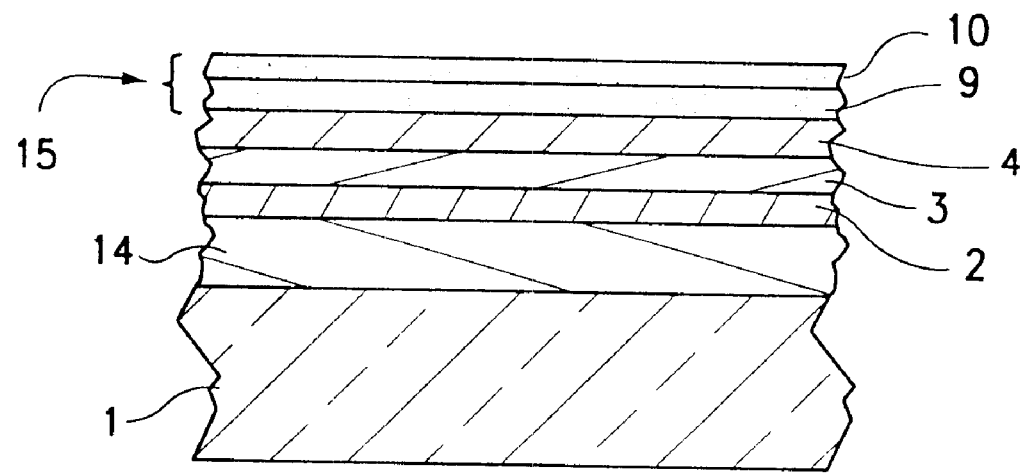
FIG. 3 is a side cross sectional view of a coated article according to another embodiment of this invention, wherein a substrate is provided with a solar management coating system thereon according to any of the FIGS. 1, 2($a$) or 2($b$) embodiments and an index matching layer is provided between the substrate and the solar management coating system in order to further reduce visible reflections.

FIG. 3 illustrates yet another embodiment of this invention which is the same as the FIG. 2(b) embodiment, except that an index matching layer 14 is provided between layer 2 and substrate 1. The purpose of index matching layer 14 is to reduce reflections off of the coated article by approximately matching the respective indices of refraction of substrate 1 and layer 2. In an exemplary embodiment of this invention, index matching layer 14 may be of or include silicon oxynitride ($SiO_xN_y$), silicon oxide, silicon nitride, tin oxide, and/or any mixture thereof. Layer 14 may be deposited to a thickness of from about 50 to 1,000 Å (more preferably from about 100 to 500 Å) in certain embodiments, preferably via sputtering.

In variations of the embodiments of FIGS. 2(a), 2(b) and 3 described above, DLC inclusive layer 9 need not be included (i.e., layer 9 is optional in each of the aforesaid embodiments). Thus, in any of these embodiments, a single DLC inclusive layer 10 may be provided under optional FAS inclusive layer 11.

Referring to the different embodiments of FIGS. 1–3, DLC inclusive protective coating system 15 is at least about 75% transparent to or transmissive of visible light rays, preferably at least about 85%, and most preferably at least about 95%. In certain to embodiments, the entire coated article of any of the FIG. 1–3 embodiments may be at least about 75% transmissive to visible light.

When substrate 1 is of glass, it may be from about 1.0 to 5.0 mm thick, preferably from about 1.0 to 4.8 mm thick, and most preferably from about 3.7 to 4.8 mm thick. In certain embodiments, another advantage of protective coating system 15 is that the ta-C (e.g., in layers 9 and/or 10) therein may reduce the amount of soda (e.g., from a soda-lime-silica glass substrate 1) that can reach the surface of the coated article and cause stains/corrosion. In such embodiments, substrate 1 may be soda-lime-silica glass and include, on a weight basis, from about 60–80% $SiO_2$, from about 10–20% $Na_2O$, from about 0–16% CaO, from about 0–10% $K_2O$, from about 0–10% MgO, and from about 0–5% $Al_2O_3$. Iron and/or other additives may also be provided in the glass composition of the substrate 1. In certain other embodiments, substrate 1 may be soda lime silica glass including, on a weight basis, from about 66–75% $SiO_2$, from about 10–20% $Na_2O$, from about 5–15% CaO, from about 0–5% MgO, from about 0–5% $Al_2O_3$, and from about 0–5$K_2O$. Most preferably, substrate 1 is soda lime silica glass including, by weight, from about 70–74% $SiO_2$, from about 12–16% $Na_2O$, from about 7–12% CaO, from about 3.5 to 4.5% MgO, from about 0 to 2.0% $Al_2O_3$, from about 0–5% $K_2O$, and from about 0.08 to 0.15% iron oxide. Soda lime silica glass according to any of the above embodiments may have a density of from about 150 to 160 pounds per cubic foot (preferably about 156), an average short term bending strength of from about 6,500 to 7,500 psi (preferably about 7,000 psi), a specific heat (0–100 degree C.) of about 0.20 Btu/lbF, a softening point of from about 1330 to 1345 degrees F., a thermal conductivity of from about 0.52 to 0.57 Btu/hrftF, and a coefficient of linear expansion (room temperature to 350 degree C.) of from about 4.7 to $5.0 \times 10^{-6}$ degrees F. Also, soda lime silica float glass available from Guardian Industries Corp., Auburn Hills, Mich., may be used as substrate 1. Any such aforesaid glass substrate 1 may be, for example, green, blue or grey in color when appropriate colorant(s) are provided in the glass in certain embodiments.

In certain other embodiments of this invention, substrate 1 may be of borosilicate glass, or of substantially transparent plastic, or alternatively of ceramic. In certain borosilicate embodiments, the substrate 1 may include from about 75–85% $SiO_2$, from about 0–5% $Na_2O$, from about 0 to 4% $Al_2O_3$, from about 0–5% $K_2O$, from about 8–15% $B_2O_3$, and from about 0–5% $Li_2O$.

In still further embodiments, an automotive window (e.g. windshield or side window) including any of the above glass substrates laminated to a plastic substrate may combine to make up substrate 1, with the solar management coating system (s) [see layers 2–15] of any of the FIGS. 1–3 embodiments provided on the outside surface of such a window. In other embodiments, substrate 1 may include first and second glass sheets of any of the above mentioned glass materials laminated or otherwise attached to one another, for use in window (e.g. automotive windshield, residential window, commercial architectural window, automotive side window, vacuum IG window, automotive backlight or back window, etc.) and/or other similar environments.

The solar management coating system (layers 2–15) of any of the embodiments of FIGS. 1–3 may be provided on any surface of the substrate in such applications. For example, in architectural windows the system may be provided on any of surfaces 1, 2, 3 or 4 in a window including two spaced apart glass sheets. Depending upon which surface of the substrate the solar management coating system is located, any of a hydrophobic, hydrophillic or neutral (not hydrophobic or hydrophilic) protective DLC inclusive system 15 may be provided as desired.

In hydrophobic embodiments where the DLC in protective system 15 is provided in a hydrophobic manner, it is noted that hydrophobic performance of the system of any of the FIGS. 1–3 embodiments is a function of contact $\theta$, surface energy $\gamma$, tilt angle $\beta$, and/or wettability or adhesion energy W.

Figure 4A:
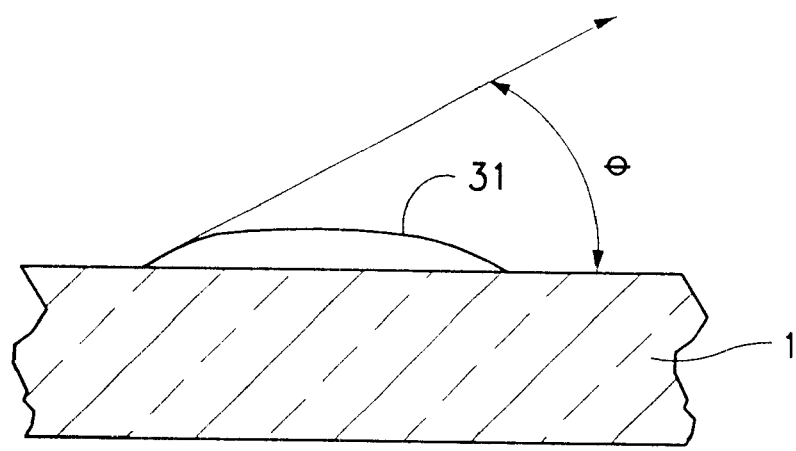
FIG. 4($a$) is a side cross sectional partially schematic view illustrating a low contact angle θ of a water drop on a glass substrate.
Figure 4B:
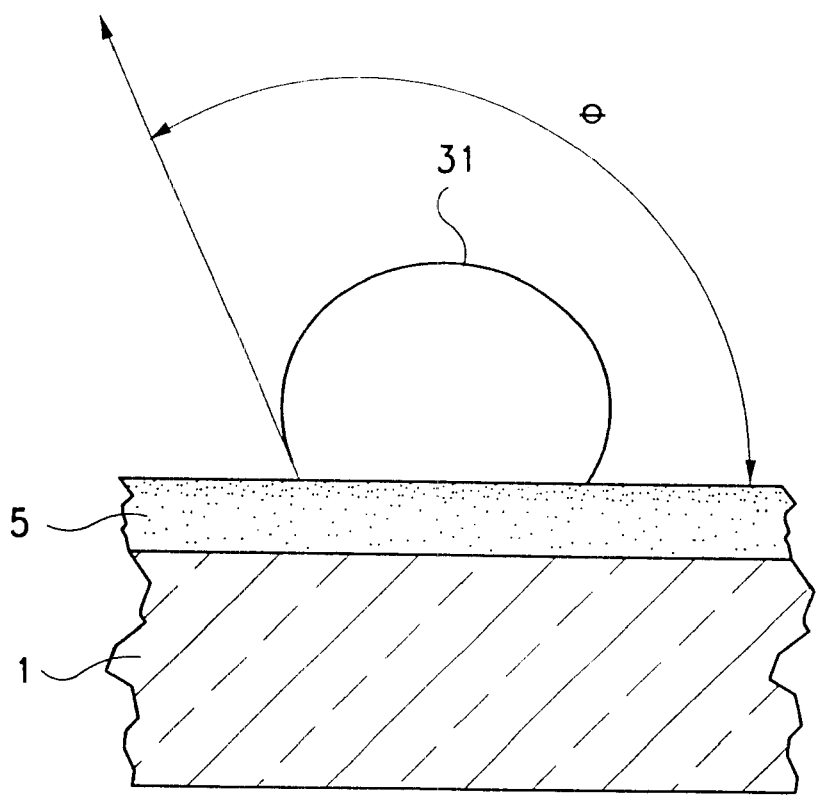

The surface energy $\gamma$ of a coating system may be calculated by measuring its contact angle $\theta$ (contact angle $\theta$ is illustrated in FIGS. 4(a) and 4(b)). FIG. 4(a) shows the contact angle of a drop on a substrate absent a hydrophobic embodiments of this invention, while FIG. 4(b) shows the contact angle of a drop on a substrate having a coating system thereon according to a hydrophobic embodiment of this invention (in FIG. 4(b) layers 2–4 are not shown for purposes of simplicity). A sessile drop 31 of a liquid such as water is placed on the coating as shown in FIG. 4(b). A contact angle $\theta$ between the drop 31 and underlying coating system (e.g., see layers 2–15 of any of the FIGS. 1–3 embodiments, with the DLC and/or FAS inclusive layers on the outside surface) appears, defining an angle depending upon the interface tension between the three phases in the point of contact. Generally, the surface energy $\gamma_C$ of a coating system can be determined by the addition of a polar and a dispersive component, as follows: $\gamma_C = \gamma_{CP} + \gamma_{CD}$, where $\gamma_{CP}$ is the coating's polar component and $\gamma_{CD}$ the coating's dispersive component. The polar component of the surface energy represents the interactions of the surface which is mainly based on dipoles, while the dispersive component represents, for example, van der Waals forces, based upon electronic interactions. Generally speaking, the lower the surface energy $\gamma_C$ of coating system 15, the more hydrophobic the coating and the higher the contact angle $\theta$.

Adhesion energy (or wettability) W can be understood as an interaction between polar with polar, and dispersive with dispersive forces, between the coating system and a liquid thereon such as water. $\gamma^P$ is the product of the polar aspects of liquid tension and coating/substrate tension; while $\gamma^D$ is the product of the dispersive forces of liquid tension and coating/substrate tension. In other words, $\gamma^P = \gamma_{LP} * \gamma_{CP}$; and $\gamma^D = \gamma_{LD} * \gamma_{CD}$; where $\gamma_{LP}$ is the polar aspect of the liquid (e.g. water), $\gamma_{CP}$ is the polar aspect of coating system; $\gamma_{LD}$ is the dispersive aspect of liquid (e.g. water), and $\gamma_{CD}$ is the dispersive aspect of the coating system. It is noted that adhesion energy (or effective interactive energy) W, using the extended Fowkes equation, may be determined by:

$$W = [\gamma_{LP} * \gamma_{CP}]^{1/2} + [\gamma_{LD} * \gamma CD]^{1/2} = \gamma_1(1 + \cos \theta),$$

where $\gamma_1$ is liquid tension and $\theta$ is the contact angle. W of two materials is a measure of wettability indicative of how hydrophobic the coating system is.

When analyzing the degree of hydrophobicity of outermost layer/portion of the coating system (e.g., at layer(s) 8, 10, or 11) with regard to water, it is noted that for water $\gamma_{LP}$ is 51 N/m and $\gamma_{LD}$ is 22 mN/m. In certain embodiments of this invention, the polar aspect $\gamma_{CP}$ of surface energy of layers 8, 10 and/or 11 is from about 0 to 0.2 (more preferably variable or tunable between 0 and 0.1) and the dispersive aspect $\gamma_{CD}$ of the surface energy of layers 8, 10 and/or 11 is from about 16–22 mN/m (more preferably from about 16–20 mN/m). Using the above-listed numbers, according to certain embodiments of this invention, the surface energy $\gamma_C$ of layer 8, 10 and/or 11 (and thus the corresponding coating system) is less than or equal to about 20.2 mN/m, more preferably less than or equal to about 19.5 mN/m, and most preferably less than or equal to about 18.0 mN/m; and the adhesion energy W between water and the coating system is less than about 25 mN/m, more preferably less than about 23 mN/m, even more preferably less than about 20 mN/m, and most preferably less than about 19 mN/m. These low values of adhesion energy W and the coating system's surface energy $\gamma_C$, and the high initial contact angles $\theta$ achievable, illustrate the improved hydrophobic nature of the coating systems according to different embodiments of this invention. While layers 8, 10 and/or 11 may (or may not) function to provide much of the hydrophobic nature of the protective coating system 15, optional underlying DLC inclusive layer 9 in certain embodiments improves the bonding characteristics of the system 15 to the substrate 1 (e.g., glass substrate) and layers 2–4, and yet still provides adequate hardness characteristics regarding the coating system as a whole.

The initial contact angle $\theta$ of a conventional glass substrate 1 with sessile water drop 31 thereon is typically from about 22–24 degrees, although it may dip as low as 17 or so degrees in some circumstances, as illustrated in FIG. 4(a). Thus, conventional glass substrates are not particularly hydrophobic in nature. When hydrophobicity is desired, protective system 15 may be deposited in a manner so as to achieve a hydrophobic result in any of the manners discussed in the parent applications. In such hydrophobic embodiments, the provision of system 15 on substrate 1 causes the contact angle $\theta$ to increase to the angles discussed herein, as shown in FIG. 4(b) for example, thereby improving the hydrophobic nature of the article. As discussed in Table 1 of Ser. No. 09/303,548, the contact angle $\theta$ of a ta-C DLC layer is typically less than 50 degrees. However, the makeup of certain hydrophobic DLC-inclusive protective coating systems 15 described herein enables the initial contact angle $\theta$ of the system relative to a water drop (i.e. sessile drop 31 of water) to be increased in certain embodiments to at least about 55 degrees, more preferably to at least about 80 degrees, still more preferably to at least about 100 degrees, even more preferably at least about 110 degrees, and most preferably at least about 125 degrees, thereby improving the hydrophobic characteristics of the DLC-inclusive coating system. An "initial" contact angle $\theta$ means prior to exposure to environmental conditions such as sun, rain, abrasions, humidity, etc.

In certain preferred embodiments of this invention, layers 2–4 are deposited on substrate 1 via a sputtering process (e.g., see the sputtering techniques discussed in the '108 patent, incorporated herein by reference). However, the layer(s) of protective DLC inclusive system 15 are preferably deposited over layers 2–4 via an ion beam deposition technique. Thus, different deposition techniques are preferably used to deposit different layers on substrate 1. However, it is noted that these deposition techniques are for purposes of example only and are not intended to be limiting; any suitable deposition technique(s) may be used in different embodiments of this invention.

Figure 5:
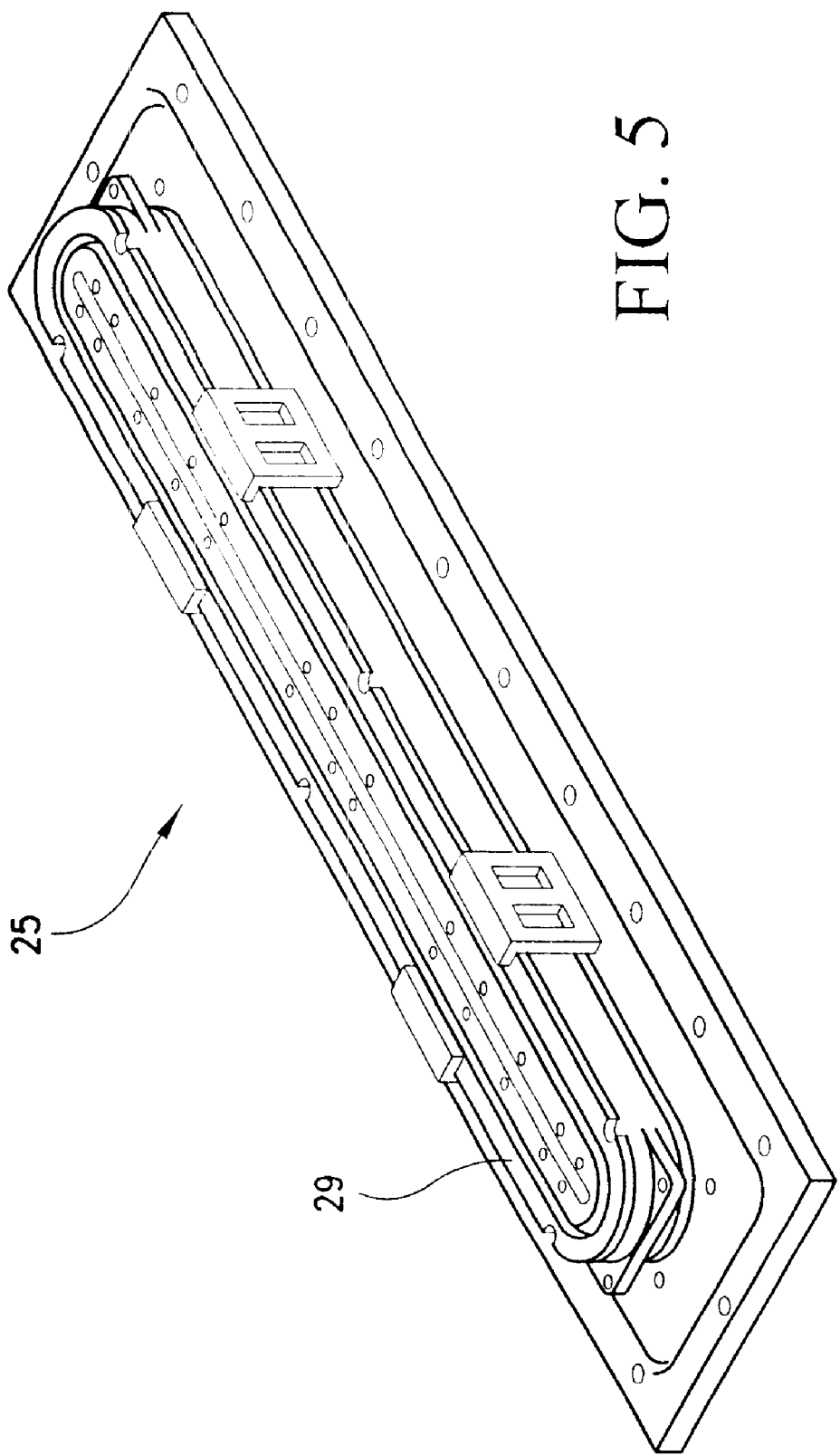
FIG. 5 is a perspective view of a linear ion beam source which may be used in any embodiment of this invention for depositing DLC inclusive layer(s) (it is noted that sputtering is a preferred method/technique for depositing the layers such as silicon nitride, Ni, NiCr, etc. under the DLC inclusive layer(s)).
Figure 6:
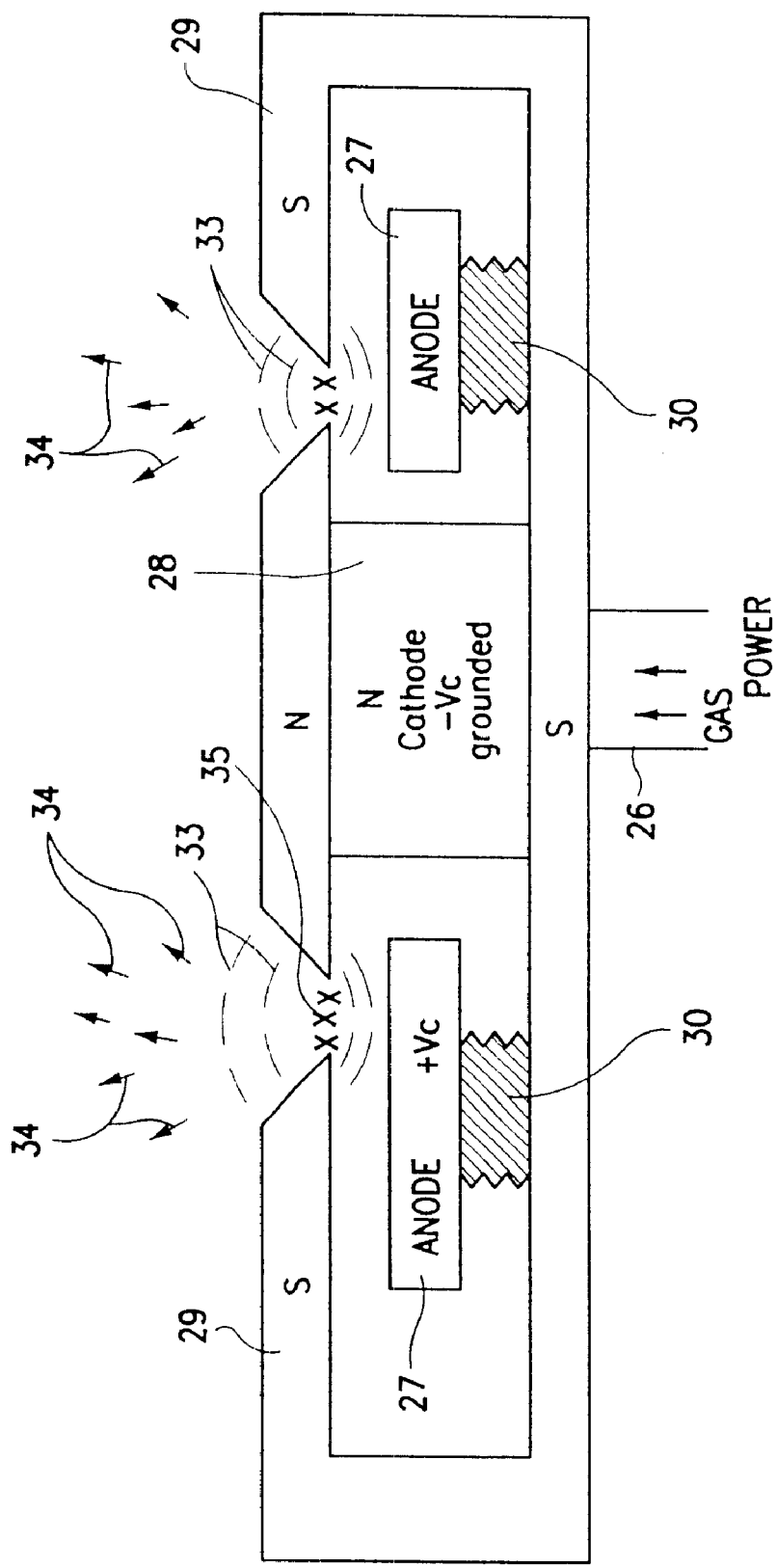
FIG. 6 is a cross sectional view of the linear ion beam source of FIG. 5.

FIGS. 5–6 illustrate an exemplary linear or direct ion beam source 25 which may be used to deposit layers 8, 9 and 10 of protective coating system 15, clean a substrate, or surface plasma treat a DLC inclusive coating system 15 with H and/or F according to different embodiments of this invention. Ion beam source 25 includes gas/power inlet 26, anode 27, grounded cathode magnet portion 28, magnet poles 29, and insulators 30. A 3 kV DC power supply may be used for source 25 in some embodiments. Linear source ion deposition allows for substantially uniform deposition of layers 9 and 10 as to thickness and stoichiometry. As mentioned above, optional FAS inclusive layer 11 is preferably not applied using ion beam technology (rubbing/buffing is a preferred deposition technique for layer 11) nor are layers 2–4, although they may be formed in such a manner in certain embodiments of this invention.

Ion beam source 25 is based upon a known gridless ion source design. The linear source is composed of a linear shell (which is the cathode and grounded) inside of which lies a concentric anode (which is at a positive potential). This geometry of cathode-anode and magnetic field 33 gives rise to a close drift condition. The magnetic field configuration further gives rise to an anode layer that allows the linear ion beam source to work absent any electron emitter. The anode layer ion source can also work in a reactive mode (e.g. with oxygen and nitrogen). The source includes a metal housing with a slit in a shape of a race track as shown in FIGS. 5–6. The hollow housing is at ground potential. The anode electrode is situated within the cathode body (though electrically insulated) and is positioned just below the slit. The anode can be connected to a positive potential as high was 3,000 or more volts (V). Both electrodes may be water cooled in certain embodiments. Feedstock/precursor gases, described herein, are fed through the cavity between the anode and cathode. The gas(es) used determines the make-up of the resulting layer(s) deposited on an adjacent substrate 1. Herein, a layer is deemed deposited "on" the substrate regardless of whether other layer(s) are located between that layer and the substrate. In other words, the term "on" herein covers both directly on and indirectly on with other layer(s) therebetween (e.g., layer system 15 is "on" substrate 1 in the FIG. 1–3 embodiments even though other layers are provided therebetween).

The linear ion source also contains a labyrinth system that distributes the precursor gas (e.g., TMS (i.e., $(CH_3)_4Si$ or tetramethylsilane); acetylene (i.e., $C_2H_2$); 3MS (i.e., trimethyldisilane); DMS (i.e., dichloro-dimethylsilane); hexane; methane; HMDSO (i.e., hexamethyldisiloxane); TEOS (i.e., tetraethoxysilane), etc.) fairly evenly along its length and which allows it to supersonically expand between the anode-cathode space internally. The electrical energy then cracks the gas to produce a plasma within the source. The ions are expelled out at energies in the order of eVc-a/2 when the voltage is Vc-a. The ion beam emanating from the slit is approximately uniform in the longitudinal direction and has a Gaussian profile in the transverse direction. Exemplary ions 34 are shown in FIG. 6. A source as long as one meter may be made, although sources of different lengths are anticipated in different embodiments of this invention. Finally, electron layer 35 is shown in FIG. 6 completes the circuit thereby enabling the ion beam source to function properly.

An advantageous of the ion beam source of FIGS. 5–6 is that it can be used to deposit protective coating system 15 at temperatures e.g., from room temperature up to about 200 degree C. In other words, it can be used to deposit system 15 over top of solar management layers 2–4 at temperatures which are low enough so that layers 2–4 are not significantly damaged or heated prematurely during the deposition of DLC inclusive protective coating system 15.

In alternative embodiments of this invention, an ion beam source device or apparatus as described and shown in FIGS. 1–3 of U.S. Pat. No. 6,002,208 (hereby incorporated herein by reference in its entirety) may be used to deposit/form DLC inclusive layers 9, 10 on substrate 1 in accordance with either the FIG. 1, FIG. 2, or FIG. 3 embodiment of this invention. One or multiple such ion beam source devices may be used.

In certain embodiments, the same ion beam source 25 may be used to deposit both of layers 9 and 10; one after the other. In other embodiments of this invention two separate ion beam sources may be provided, a first for depositing layer 9 on substrate 1 over layers 2–4 and the second for depositing layer 10 over layer 9. After layers 9 and 10 are deposited, FAS inclusive layer 11 is preferably applied thereon via a rubbing process of any other suitable deposition technique.

Figure 7:
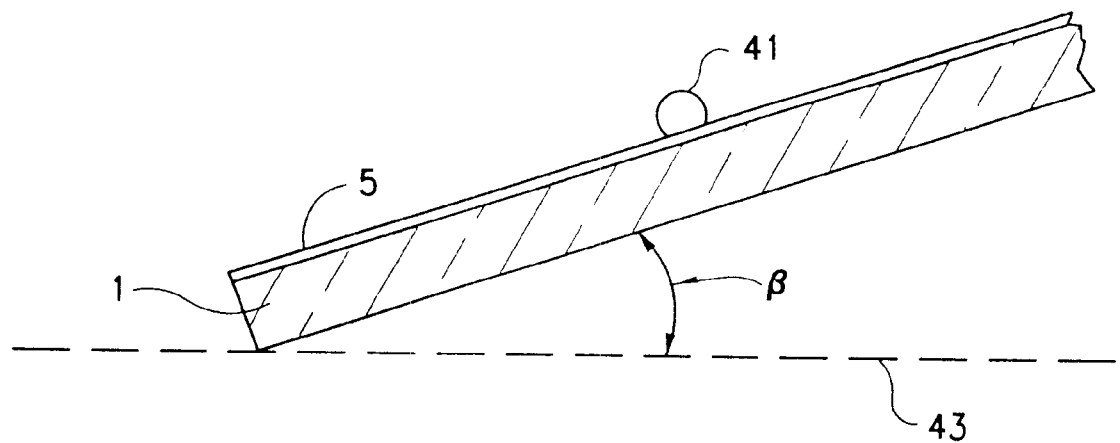
FIG. 7 is a diagram illustrating tilt angle as discussed herein in accordance with certain embodiments of this invention.

Referring to FIG. 7, tilt angle β characteristics associated with certain embodiments of this invention will be explained. In a hydrophobic coating, it is often desirable in certain embodiments to have a high contact angle θ (see FIG. 4(b)) in combination with a low tilt angle β. As shown in FIG. 7, tilt angle β is the angle relative to the horizontal 43 that the coated article must be tilted before a 30 μL (volume) drop 41 (e.g., of water) thereon begins to flow down the slant at room temperature without significant trail. A low tilt angle means that water and/or other liquids may be easily removed from the coated article upon tilting the same or even in high wind conditions. In certain embodiments of this invention, coated articles herein have an initial tilt angle β of no greater than about 30 degrees, more preferably no greater than about 20 degrees, and even more preferably no greater than about 10 degrees. In certain embodiments, the tilt angle does not significantly increase over time upon exposure to the environment and the like, while in other embodiments it may increase to some degree over time. It is stressed that such tilt angles and hydrophobicity are not always desired and are optional aspects of this invention.

Referring to FIGS. 2(a) and 5–6, an exemplary method of depositing a solar management coating system on substrate 1 will now be described. This method is for purposes of example only, and is not intended to be limiting.

Initially, solar management layers 2–4 are sputtered onto substrate 1 using appropriate targets as described in U.S. Pat. No. 5,837,108, incorporated herein by reference. After sputter deposition of layers 2–4, the deposition process for DLC inclusive layers 9 and 10 begins using a linear ion beam deposition technique via one or two ion beam source(s) as shown in FIGS. 5–6, or in FIGS. 1–3 of the '208 patent; with a conveyor having moved the substrate 1 with layers 2–4 thereon to a position under the ion beam source. The ion beam source functions to deposit a DLC inclusive layer 9 on substrate 1 over layers 2–4 so as to be in contact with layer 4 (e.g., layer 4 may be of silicon nitride to improve bonding between layers 4 and 9), with at least TMS being used as the precursor or feedstock gas fed through the source for the deposition of layer 9. Because of the Si in the TMS gas used in the source, the resulting layer 9 formed on substrate includes at least Si as well as DLC. The Si portion of DLC inclusive layer 9 enables good bonding of layer 9 to layer 4, and thus will also improve the bonding characteristics of layer 10 to the substrate 1.

After layer 9 has been formed, either the same or another ion beam source is used to deposit layer 10 over (directly on in preferred embodiments) layer 9. To deposit overlying DLC inclusive layer 10, another gas such as at least $C_2H_2$ is fed through the source so that the source expels the ions necessary to form layer 10 overlying layer 9 on substrate 1 and over layers 2–4. The $C_2H_2$ gas may be used alone, or in exemplary alternative embodiments the gas may be produced by bubbling a carrier gas (e.g. $C_2H_2$) through a precursor monomer (e.g. TMS or 3MS) held at about 70 degree C. (well below the flashing point). Acetylene feedstock gas ($C_2H_2$) is used in certain embodiments for depositing layer 10 to prevent or minimize/reduce polymerization (layer 9 may be polymerized in certain embodiments) and to obtain an appropriate energy to allow the ions to penetrate the surface of layer 9 and subimplant therein, thereby causing layer 10 to intermix with layer 9 in at least an interface portion between the layers. The actual gas flow may be controlled by a mass flow controller (MFC) which may be heated to about 70 degree C. In certain optional embodiments, oxygen ($O_2$) gas may be independently flowed through an MFC. The temperature of substrate 1 may be room temperature; an arc power of about 1000 W may be used; precursor gas flow may be about 25 sccm; the base pressure may be about $10^{-6}$Torr. The optimal ion energy window for the majority of layers 9, 10 is from about 100–1,000 eV (preferably from about 100–400 eV) per carbon ion. At these energies, the carbon in the resulting layers 9 and/or 10 emulates diamond, and $sp^3$ C—C bonds form. However, compressive stresses can develop in ta-C when being deposited at 100–150 eV. Such stress can reach as high as 10 GPa and can potentially cause delamination from many substrates. It has been found that these stresses can be controlled and decreased by using an ion energy during the deposition process in a range of from about 200–1,000 eV.

As stated above, layers 9 and 10 intermix with one another at the interface between the two layers, thereby improving the bonding between the layers. At particle energies (carbon energies) of several hundred eV, a considerable material transport can take place over several atomic distances. This is caused by the penetration of fast ions and neutrals as well as by the recoil displacement of struck atoms. At sufficiently high particle energies and impact rates, there is an enhanced diffusion of the thermally agitated atoms near the film surface that occurs via the continuously produced vacancies. In the formation of ta-C:H, these effects can help improve film adhesion by broadening the interface (i.e., making it thicker, or making an interfacial layer between the two layers 9 and 10 due to atom mixing). Layers 9 and 10 are contiguous due to this intermixing, and this "smearing" between the layers enhances the adhesion of layer 10 to both layer 9 and thus the substrate 1.

High stress is undesirable in the thin interfacing portion of layer 9 that directly contacts the surface of layer 4 in the FIG. 2(a) embodiment. Thus, for example, the first 1–40% thickness (preferably the first 1–20% and most preferably the first 5–10% thickness) of layer 9 may optionally be deposited using high anti-stress energy levels of from about 200–1,000 eV, preferably from about 400–500 eV. Then, after this initial interfacing layer portion of layer 9 has been grown, the ion energy in the ion deposition process may be decreased (either quickly or gradually while deposition continues) to about 100–200 eV, preferably from about 100–150 eV, to grow the remainder of layer(s) 9 and/or layer 10. Thus, in certain embodiments, because of the adjustment in ion energy and/or gases during the deposition process, DLC inclusive layers 9, 10 may optionally have different densities and different percentages of $sp^3$ C—C bonds at different layer portions thereof (the lower the ion energy, the more $sp^3$ C—C bonds and the higher the density). Alternatively, the same energy may be used to deposit all of layers 9 and/or 10 in certain embodiments of this invention.

While direct ion beam deposition techniques are preferred in certain embodiments, other methods of deposition may also be used in different embodiments. For example, filtered cathodic vacuum arc ion beam techniques may be used to deposit layers 9, 10. Also, in certain embodiments, $CH_4$ may be used as a feedstock gas during the deposition process instead of or in combination with the aforesaid $C_2H_2$ gas.

Optionally, the outer surface of layer 10 may be treated using a plasma treatment by another source or grafting procedure (prior to formation of FAS layer 11). This technique using an ion beam source may remove certain polar functional groups at the outermost surface of layer 10, thereby altering the surface chemical reactivity (i.e. lowering surface energy) of layer 10. In such optional embodiments, after a conveyor has moved the DLC-coated substrate from the source station to a position under this another source, the plasma treatment by this source may introduce, e.g., hydrogen (H) atoms into the outermost surface of layer 10, thereby making layer 10's surface substantially non-polar and less dense than the rest of layer 10. These H atoms are introduced, because $H_2$ and/or $ArH_2$ feedstock gas is used by this source in certain embodiments. Thus, this source does not deposit any significant amounts of C atoms or Si atoms; but instead treats the outermost surface of layer 10 by adding H atoms thereto in order to improve its hydrophobic characteristics. This plasma treatment may also function to roughen the otherwise smooth surface. It is noted that $H_2$ feedstock gas is preferred in the ion beam source when it is not desired to roughen the surface of protective coating system 15, while $ArH_2$ feedstock gas is preferred in surface roughing embodiments. In other optional embodiments, this source may be used to implant F ions/atoms in to the outermost surface of layer 10.

After DLC inclusive layers 9 and 10 have been formed on substrate 1 and over layers 2–4, FAS inclusive layer 11 is applied thereto (e.g., by rubbing or otherwise applying this layer 11 in any other suitable manner).

Optionally, after FAS inclusive layer 11 has been formed on the substrate 1, the coated article may be heated (e.g., up to about 100 degree C. in certain embodiments, or up to about 300 degree C. in other embodiments). Surprisingly, it has been found that heating the coated article in such a manner improves the durability of FAS inclusive layer 11, and thus of the overall coating system. It is thought that such hearing may "cure" layer 11 or otherwise cause it to more completely bond to itself and/or layer 10.

Optionally, when it is desired to heat treat (e.g., temper, anneal, etc.) the resulting coated article, this curing of the FAS may be carried out during such heat treatment at the same time that annealing, tempering, bending, or the like is being performed.

Figure 10:
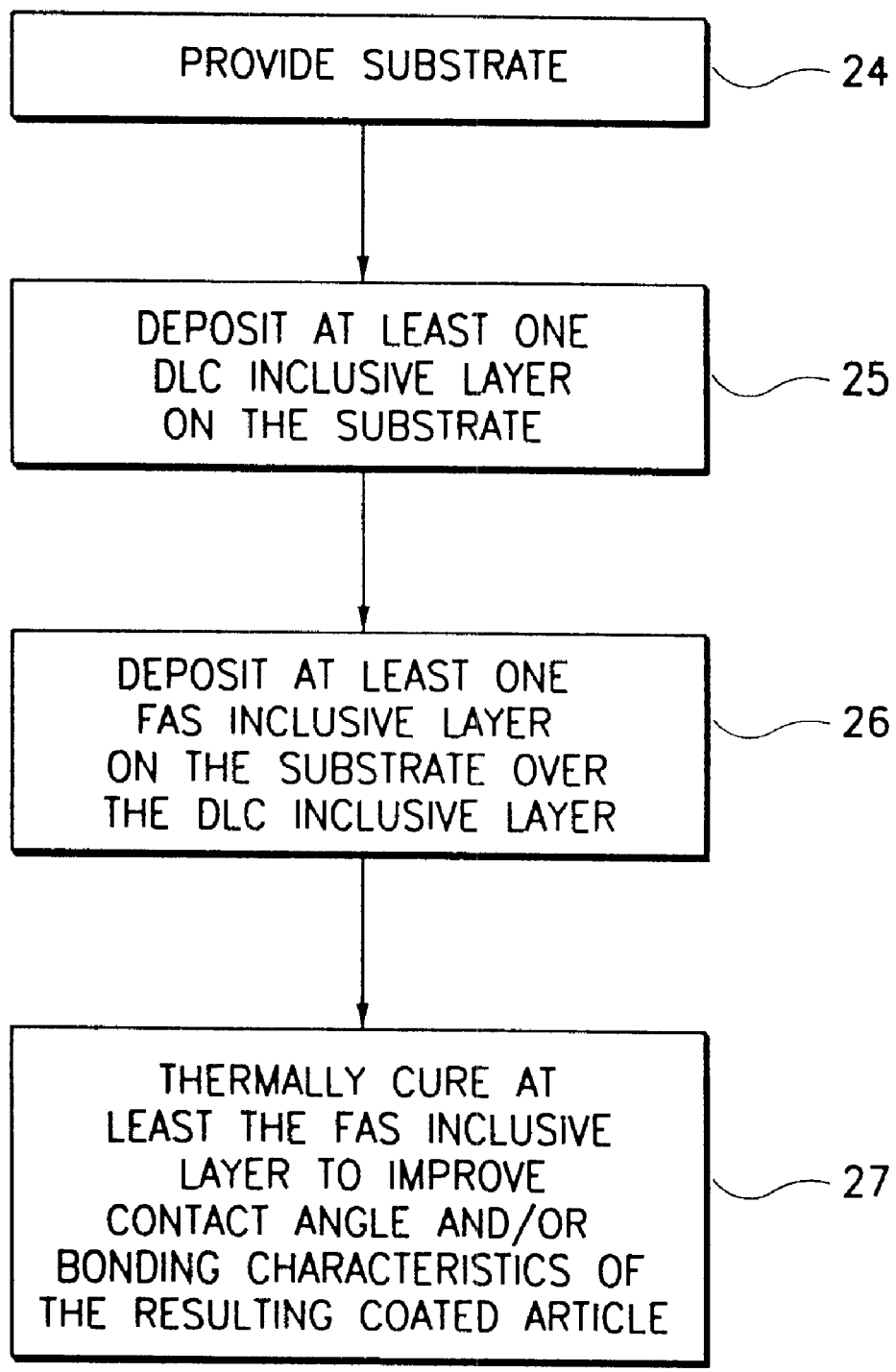
FIG. 10 is a flowchart illustrating how the FAS inclusive layer of the FIG. 2($a$) embodiment may be thermally cured according to an embodiment of this invention.

In this regard, FIG. 10 is a flowchart illustrating certain steps taken in the manufacture of a coated article according to an embodiment of this invention. These steps are preferably performed when the resulting coated article is not to be tempered, bent, or annealed after deposition of the coating system, but in certain embodiments may be performed prior to such processes when they are to be conducted. In this regard, a substrate (e.g., glass, plastic, or ceramic substrate) is provided at step 24, with layers 2–4 thereon. At least one DLC inclusive protective layer (e.g., one or more of layers 8, 9, 10,) is deposited on the substrate at step 25. Following formation of the DLC inclusive layer(s), an FAS compound inclusive layer (e.g., layer 11) is deposited on the substrate in step 26. The FAS inclusive layer is preferably deposited directly on the upper surface of a DLC inclusive layer in certain embodiments of this invention, but alternatively other layer(s) may be located between the DLC inclusive layer(s) and the FAS inclusive layer.

After the DLC and FAS inclusive layers have been deposited on the substrate, the entire coated article (or alternatively only the FAS inclusive layer) is subjected to heating for curing purposes in step 27. The heating may take place in any suitable oven or furnace, or alternatively may be implemented by an IR or any other type of localized heating device. This heating may be at a temperature of from about 50 to 300 degree C., more preferably at a temperature of from about 70 to 200 degree C., and even more preferably at a temperature of from about 70–100 degree C. However, it is noted that as the heating time goes up, the required temperature goes down. Thus, for purposes of example only, the heating may be conducted at about 80 degree C. for about 60 minutes (1 hour). Alternatively, the heating may be conducted at about 250 degree C. for about 5 minutes, or at about 150 degree C. for about 20 minutes. The time which the coated article is subjected to heating may range from about 20 seconds to 2 hours in certain embodiments of this invention, more preferably from about one (1) minute to one (1) hour, depending on the temperature used. In preferred embodiments of this invention, at least the FAS inclusive layer (and preferably the entire coated article) is heated at a temperature and for a period of time sufficient to achieve one or more of the advantages discussed above. Thus, when it is desired to keep the temperature(s) of layers 1–4 as low as possible, layer 11 need not be heated at all; or alternatively it may be heated at lesser temperature(s), e.g., 75 degree C., or 40 degree C., for longer periods of time than would be required at higher temperatures.

DLC inclusive protective coating system 15 according to different embodiments of this invention may have the following characteristics: coefficient of friction of from about 0.02 to 0.15; good abrasion resistance; an average density of from about 2.0 to 3.0 g/cm$^2$; permeability barrier to gases and ions; surface roughness less than about 0.5 nm; inert reactivity to acids, alkalis, solvents, salts and water; corrosion resistance; variable or tunable surface tension; tunable optical bandgap of from about 2.0 to 3.7 eV; IR transmission @10 µm of at least about 85%; UV transmission @350 nm of no greater than about 30%; tunable refractive index @550 nm [n=1.6 to 2.3; k=0.0001 to 0.1], permittivity @GHz 4.5; an undoped electrical resistivity of at least about $10^{10}$ Ω/cm; dielectric constant of about 11 @10 kHz and 4@100 MHz; an electrical breakdown strength (V cm$^{-1}$) of about $10^6$; thermal coefficient of expansion of about $9\times10^{-6}$/C; and thermal conductivity of about 0.1 Wcm K.

Three examples of optional TMS-formed DLC inclusive anchor layers 9 are as follows. Each such layer 9 was deposited on a substrate using tetramethylsilane (TMS) and O$_2$ gas introduced within the linear ion beam source apparatus of FIGS. 5–6. All samples were of approximately the same thickness of about 750 A. A low energy electron flood gun was used to sharpen the spectral analysis conducted by x-ray photo electron spectroscopy (XPS) for chemical analysis. In XPS analysis of a layer 9, high energy x-ray photons (monochromatic) impinge on the surface of the layer. Electrons from the surface are ejected and their energy and number (count) measured. With these measurements, one can deduce the electron binding energy. From the binding energy, one can determine three things: elemental fingerprinting, relative quantity of elements, and the chemical state of the elements (i.e. how they are bonding). Components used in the XPS analysis include the monochromatic x-ray source, an electron energy analyzer, and electron flood gun to prevent samples from charging up, and an ion source used to clean and depth profile. Photoelectrons are collected from the entire XPS field simultaneously, and using a combination of lenses before and after the energy analyzer are energy filtered and brought to a channel plate. The result is parallel imaging in real time images. Sample Nos. 1–3 of DLC inclusive layer 9 were made and analyzed using XPS, which indicated that the samples included the following chemical elements by atomic percentage (H was excluded from the chart below).

CHART 3

| Sample No. | C | O | Si | F |
|---|---|---|---|---|
| 1 | 54.6% | 23.7% | 20.5% | 1.2% |
| 2 | 45.7% | 21.7% | 32.7% | 0% |
| 3 | 59.5% | 22.7% | 17.8% | 0% |

H was excluded from the XPS analysis because of its difficulty to measure. Thus, H atoms present in the coating Sample Nos. 1–3 of Chart 3 were not taken into consideration for these results. For example, if Sample No. 1 in Chart 3 included 9% H by atomic percentage, then the atomic percentages of each of the above-listed elements C, O, Si and F would be reduced by an amount so that all five atomic percentages totaled 100%. As can be seen, F is optional and need not be provided. Oxygen is also optional.

While TMS is described above as a primary precursor or feedstock gas utilized in the ion beam deposition source for depositing the optional underlying DLC inclusive layer 9, other gases may in addition or instead be used. For example, other gases such as the following may be used either alone, or in combination with TMS, to form layer 9: silane compounds such as TMS, diethylsilane, TEOS, dichlorodimethylsilane, trimethyldisilane, hexamethyldisiloxane, organosilane compounds; organosilazane compounds such as hexamethyldisilazane and tetramethyldisilazane; and/or organo-oxysilicon compounds such as tetramethyldisiloxane, ethoxytrimethylsilane, and organo-oxysilicon compounds. Each of these gases includes Si; and each of these gases may be used either alone to form layer 9, or in combination with one or more of the other listed gases. In certain embodiments, the precursor gas may also further include N, F and/or O in optional embodiments, for layer 9 and/or layer 10.

With regard to layer 10, a hydrocarbon gas such as acetylene is preferred for forming the layer. However, other gases such as ethane, methane, butane, cyclohexane, and/or mixtures thereof may also (or instead) be used in the ion beam source to form layer 10.

In certain embodiments of this invention (e.g., see FIGS. 1–3) when hydrophobicity is desired, protective coating system 15 (and thus the entire solar management coating system) has a contact angle of at least about 70°, more preferably at least about 80°, and even more preferably at least about 100° after a taber abrasion resistance test has been performed pursuant to ANSI Z26.1. The test utilizes 1,000 rubbing cycles of a coating system, with a load a specified in Z26.1 on the wheel(s). Another purpose of this abrasion resistance test is to determine whether the coated article is resistive to abrasion (e.g. whether hazing is less than 4% afterwards). ANSI Z26.1 is hereby incorporated into this application by reference.

FIGS. 8–9 illustrate the makeup of a protective coating system 15 including layers 9, 10, and 11 deposited on a substrate (absent layers 2–4) according to an embodiment of this invention. However, FIGS. 8 and 9 must be looked at together to span the entire coating system of layers 9–11. FIG. 8 shows the make-up with regard to C, O and Si for layers 9 and 10, while FIG. 9 shows the make-up with regard to C, O and Si for layer 11, throughout the respective thicknesses of these layers. X-ray Photoelectron Spectroscopy (XPS)/Electron Spectroscopy for Chemical Analysis (ESCA) was used to develop these graphs from sample products. This is used to characterize inorganic and organic solid materials. In order to perform such measurements on sample products as was done with regard to FIGS. 8–9, surfaces of the coating system were excited with Al monochromatic x-rays (1486.6 eV) and the photoelectrons ejected from the surface were energy analyzed. Low resolution analysis, i.e., a survey scan, can be used to identify elements (note that H, He, and F were not included in the analysis of FIGS. 8–9 even though at least H and/or F were present in the coating system) and establish the illustrated concentration table in units of atomic percentage (%). Detection limits were from about 0.1 to 0.05 atom %. High resolution analysis of individual photoelectron signals, i.e., C 1 s, can be used to identify chemical bonding and/or oxidation state. Information on the surface is obtained from a lateral dimension as large as 1 mm diameter and from a depth of 0–10 $\mu$m. To acquire information from slightly greater depths, angle resolved measurements can be made.

FIG. 8 illustrates the makeup with regard to C, O and Si throughout the thicknesses of DLC inclusive layers 9 and 10 of protective coating system 15 of the FIG. 2($a$) embodiment (i.e., no FAS layer was on layers 9 and 10 when this data was measured, so as to resemble FIG. 2($b$)). Cycle number 1 is at the outer surface of layer 10, while cycle number 19 is believed to be within the underlying glass substrate 1 (remember, layers 9–10 were deposited directly on a glass substrate absent layers 2–7 for purposes of this test). Thus, it is believed that the interface between glass substrate 1 and underlying DLC inclusive layer 9 is at about cycle number 15 where the C % begins to significantly decrease. The "time" and "depth" columns refers to depth into layers 10, 9 from the exterior surface of layer 10 as compared to the depth into a conventional $SiO_2$ that would be achieved over the same time period. Thus, the angstrom depth illustrated in FIG. 8 is not the actual depth into layers 10, 9, but instead is how deep into a $SiO_2$ layer the sputtering would reach over the corresponding time. In FIG. 8, cycle number 1 may be affected from contamination of the outer surface of layer 10 and may be disregarded in effect. At least cycle numbers 2–6 refer or correspond to DLC inclusive layer 10 as evidenced by the high carbon amounts (i.e., greater than 94% C in layer 10 according to FIG. 8). Meanwhile, at least cycle numbers 9–13 refer or correspond to underlying DLC inclusive layer 9, as evidence by the lower C amounts shown in FIG. 8. Thus, it can be seen that layer 9 includes less C than layer 10, and is therefor less dense and less hard. Moreover, it can be seen that layer 9 includes more Si than layer 10 (and optionally more oxygen (O)). Cycle numbers 7–8 refer or correspond to the interface or intermixing layer portion between layers 9 and 10; as the coating system 15 at these thickness portions includes C and Si amounts between the amounts in respective layers 9 and 10. Thus, these cycle numbers 7–8 illustrate the intermixing (i.e., subimplantation of atoms from layer 10 in layer 9) or smearing between layers 9, 10 discussed herein. Meanwhile, cycle numbers 14–15 refer or correspond to the interfacial layer between layer 9 and the glass substrate, while cycle numbers 16–19 refer or correspond to the glass itself with its high $SiO_2$ content.

FIG. 9 illustrates a similar make-up, but of FAS layer 11 (i.e., with regard to only C, O and Si throughout the thickness of layer 11). The layer 11 analyzed in FIGS. 9–10 was of the $CF_3(CH_2)_2Si(OCH_3)_3$ type of FAS. Cycle number 1 is at the exterior surface of layer 11 where layer 11 meets the surrounding atmosphere, while cycle number 11 is believed to be in layer 11 near where the layer 11 meets the exterior surface of DLC inclusive layer 10. As can be seen by comparing FIGS. 8 and 9, the FAS inclusive layer 11 has much less carbon than does layer 10.

Figure 11:
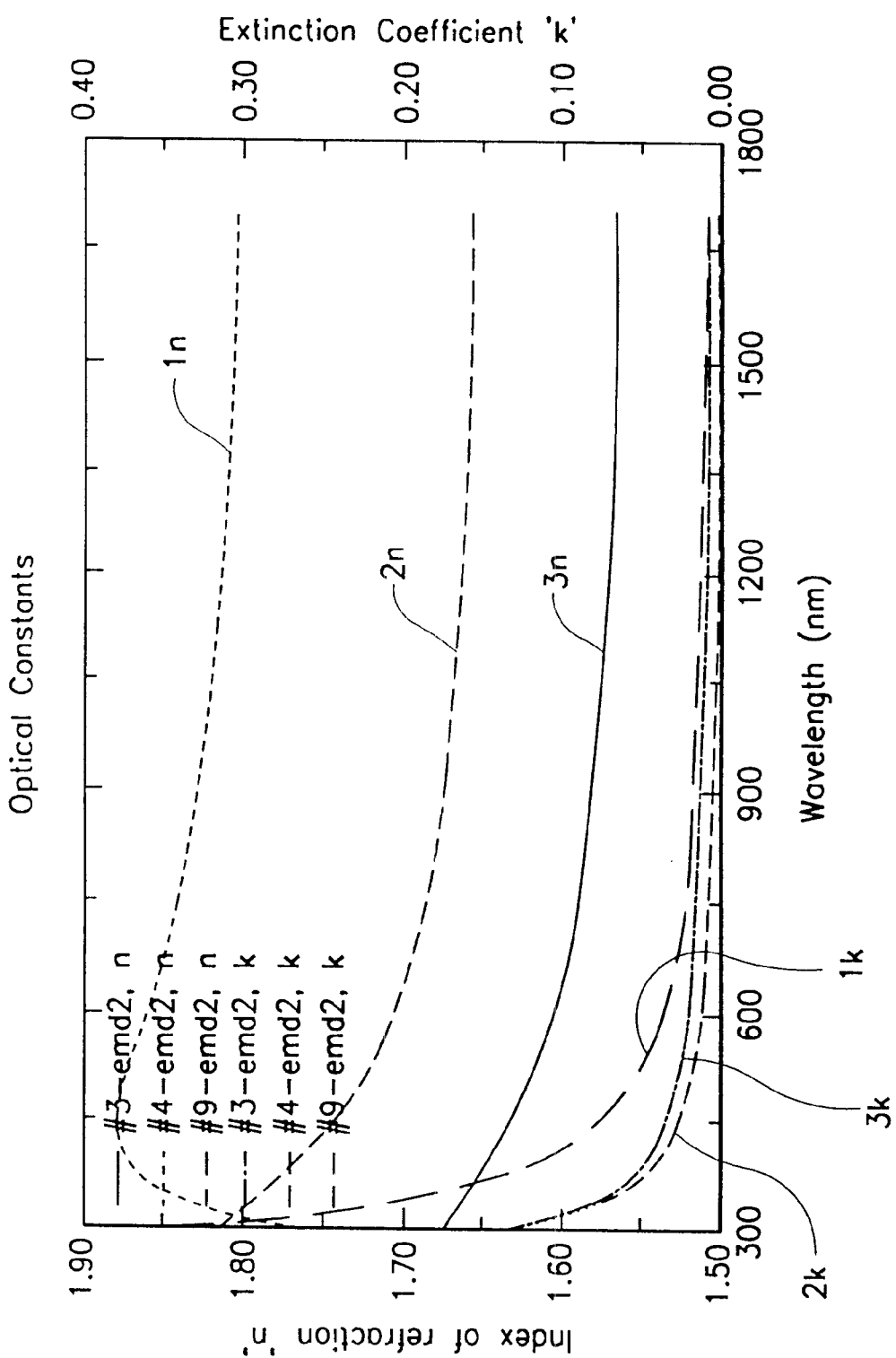
FIG. 11 is a graph illustrating certain "n" and "k" values associated with certain DLC inclusive layers according to certain embodiments of this invention.

FIG. 11 is a graph illustrating "n" and "k" values for different DLC inclusive layers according to certain embodiments of this invention. Curves 1$n$ and 1$k$ illustrate the "n" and "k" values for a DLC inclusive layer formed using $C_2H_2$ gas, respectively. Curves 2$n$ and 2$k$ illustrate the "n" and "k" values for a DLC inclusive layer formed using TMS gas, respectively. Curves 3$n$ and 3$k$ illustrate the "n" and "k" values for a DLC inclusive layer formed using $C_2H_2$/HMDSO gas, respectively. As can be seen, the DLC inclusive layer formed using $C_2H_2$ gas generally has higher "n" and "k" values than the other two DLC inclusive layers. The indices of refraction may be utilized so that a DLC inclusive layer adjacent a layer such as silicon nitride in certain embodiments of this invention does not result in too much undesirable reflection(s). In other words, different DLC inclusive layers may be utilized in an attempt to closely match indices of refraction of DLC layer(s) with indices of layers such as silicon nitride in order to reduce reflections off of the coated article.

Figure 12:
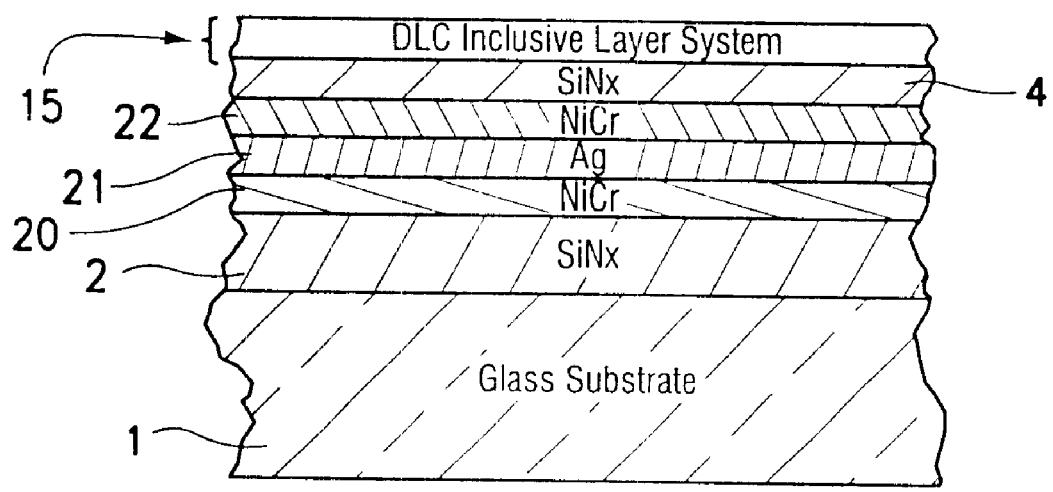
FIG. 12 is a side cross sectional view of yet another embodiment of this invention.

FIG. 12 is a side cross sectional view of a coated article according to yet another embodiment of this invention. The FIG. 12 coated article includes glass substrate 1, a solar management layer arrangement including first dielectric layer 2 (e.g., silicon nitride or silicon oxynitride in certain embodiments), NiCr or $NiCrO_x$ layer 20, IR reflecting Ag inclusive layer 21, second NiCr or $NiCrO_x$ layer 22, second dielectric layer 4 (e.g., silicon nitride or silicon oxynitride in certain embodiments), and DLC inclusive system 15. DLC inclusive layer system may be any of the systems 15 described above. For example, system may simply be layer 8, or alternatively may be layers 9, 10 and 11, or alternatively may be layers 9 and 10 according to any of the embodiments above.

As will be appreciated by those skilled in the art, coated articles according to different embodiments of this invention may be utilized in the context of automotive windshields, automotive side windows, automotive backlites (i.e., rear windows), architectural windows, residential windows, ceramic tiles, shower doors, and the like.

Once given the above disclosure, many other features, modifications, and improvements will become apparent to the skilled artisan. Such other features, modifications, and improvements are, therefore, considered to be a part of this invention, the scope of which is to be determined by the following claims.

What is claimed is:

1. A coated article comprising:
   a glass substrate;
   a solar management layer arrangement including a metallic nickel (Ni) inclusive layer sandwiched between first and second layers comprising silicon nitride; and
   a layer comprising hydrogenated amorphous diamond-like carbon (DLC) including tetrahedral amorphous carbon (ta-C), said layer comprising amorphous DLC having more $sp^3$ carbon-carbon bonds than $sp^2$ carbon-carbon bonds and being provided on said substrate in a manner such that said solar management layer arrangement is located between said substrate and said layer comprising amorphous DLC.

2. The coated article of claim 1, wherein the coated article has an initial contact angle $\theta$ of at least about 55 degrees.

3. The coated article of claim 1, wherein said Ni inclusive layer comprises NiCr.

4. The coated article of claim 1, wherein said silicon nitride comprises $Si_3N_4$.

5. The coated article of claim 1, wherein said layer comprising DLC is deposited via an ion beam deposition process in a manner such that said substrate is maintained at temperature(s) no greater than about 200 degree C. during the process for depositing the layer comprising DLC.

6. The coated article of claim 1, wherein C atoms of the layer comprising DLC are subimplanted into said second layer comprising silicon nitride.

7. The coated article of claim 1, wherein the solar management arrangement has a sheet resistance ($R_s$) of less than 300 ohms/square.

8. The coated article of claim 1, where in the solar management arrangement has a sheet resistance ($R_s$) of less than 20 ohms/square.

9. The coated article of claim 1, wherein the coated article has a visible transmission of from 60–80%.

10. A coated article comprising:
 a substrate;
 a solar management coating system provided on said substrate, said solar management coating system including at least one metallic infrared (IR) reflecting layer, a first dielectric layer, and a protective substantially non-crystalline layer comprising amorphous diamond-like carbon (DLC) having more $sp^3$ carbon-carbon bonds than $sp^2$ carbon-carbon bonds; and
 wherein said first dielectric layer is located between said layer comprising DLC and said metallic IR reflecting layer.

11. The coated article of claim 10, wherein said layer comprising DLC includes highly tetrahedral amorphous carbon, and wherein said first dielectric layer includes silicon (Si), and wherein said metallic IR reflecting layer comprises one of Ag and NiCr.

12. The coated article of claim 10, wherein said layer comprising DLC is hydrogenated and has an average density of at least about 2.4 gm/cm$^3$.

13. The coated article of claim 10, wherein said coating system further includes a second Si inclusive dielectric layer disposed between said IR reflecting layer and said substrate.

14. The coated article of claim 13, wherein each of said first and second dielectric layers comprise silicon nitride.

15. The coated article of claim 14, wherein said IR reflecting layer comprise s one of NiCr and Ag.

16. The coated article of claim 10, wherein said coating system comprises first and second layers comprising amorphous DLC located outwardly of said IR reflecting layer.

17. The coated article of claim 16, wherein each of said first and second layers comprising DLC include highly tetrahedral amorphous carbon.

18. The coated article of claim 10, further comprising a fluoro-alkyl silane (FAS) compound inclusive layer located on said substrate such that said layer comprising DLC is located between said FAS compound inclusive layer and said IR reflecting layer.

19. The coated article of claim 10, wherein said layer comprising DLC has an average hardness of at least about 10 GPa.

20. The coated article of claim 10, wherein said coating system includes first and second layers comprising amorphous DLC, said first layer comprising DLC including silicon (Si) and being provided between said second layer comprising DLC and said substrate; and
 wherein said second layer comprising DLC is deposited in a manner so that at least a portion of said second layer comprising DLC has a greater hardness and higher density than said first layer comprising DLC.

21. The coated article of claim 20, wherein said first layer comprising DLC has more silicon (Si) than said second layer comprising DLC.

22. The coated article of claim 21, wherein each of said first and second layers comprising DLC include $sp^3$ carbon-carbon bonds.

23. The coated article of claim 20, wherein said coating system further includes an FAS inclusive layer provided on said second layer comprising DLC so that said second layer comprising DLC is located between said first layer comprising DLC and said FAS inclusive layer.

24. The coated article of claim 10, wherein said coated article has an initial contact angle of at least about 100 degrees.

25. The coated article of claim 22, wherein said initial contact angle is at least about 110 degrees.

26. The coated article of claim 10, further comprising a fluoro-alkyl silane (FAS) compound inclusive layer located on said substrate such that said layer comprising DLC is located between said FAS compound inclusive layer and said IR reflecting layer; and
 wherein said FAS compound includes at least one of: $CF_3(CH_2)_2Si(OCH_3)_3$; $CF_3(CF_2)_5(CH_2)_2Si(OCH_2CH_3)_3$; $CF_3(CH_2)_2SiCl_3$; $CF_3(CF_2)_5(CH_2)_2SiCl_3$; $CF_3(CF_2)_7(CH_2)_2Si(OCH_3)_3$; $CF_3(CF_2)_5(CH_2)_2Si(OCH_3)_3$; $CF_3(CF_2)_7(CH_2)_2SiCl_3$; $CF_3(CF_2)_7(CH_2)_2SiCH_3Cl_2$; and $CF_3(CF_2)_7(CH_2)_2SiCH_3(OCH_3)_2$.

27. The coated article of claim 10, wherein C atoms of the layer comprising DLC are subimplanted into a dielectric layer provided over the IR reflecting layer.

28. The coated article of claim 10, wherein the solar management coating system has a sheet resistance ($R_s$) of less than 300 ohms/square.

29. The coated article of claim 10, wherein the solar management coating system has a sheet resistance ($R_s$) of less than 20 ohms/square.

30. The coated article of claim 10, wherein the coated article has a visible transmission of from 60–80%.

31. A coated article comprising:
 a glass substrate;
 a first dielectric layer on said substrate;
 a metallic IR reflecting layer comprising one of Ag and NiCr provided on said substrate, wherein said first dielectric layer is located between said metallic IR reflecting layer and said substrate;
 a second dielectric layer on said substrate, wherein said metallic IR reflecting layer is located between said first and second dielectric layers;
 a layer comprising hydrogenated amorphous diamond-like carbon (DLC)) having more $sp^3$ carbon-carbon bonds than $sp^2$ carbon-carbon bonds, wherein said IR reflecting layer is located between said substrate and said layer comprising amorphous DLC.

32. The coated article of claim 31, wherein C atoms of the layer comprising DLC are subimplanted into the second dielectric layer.

33. The coated article of claim 31, wherein a coating including the metallic IR reflecting layer has a sheet resistance ($R_s$) of less than 300 ohms/square.

34. The coated article of claim 31, wherein a coating including the metallic IR reflecting layer has a sheet resistance ($R_s$) of less than 20 ohms/square.

35. The coated article of claim 31, wherein the coated article has a visible transmission of from 60–80%.

36. A coated article comprising:
 a glass substrate;
 a solar management layer arrangement including a metallic IR reflecting layer located between first and second silicon nitride inclusive layers; and a hydrogenated diamond-like carbon (DLC) inclusive layer including tetrahedral amorphous carbon (ta-C), said DLC inclusive layer being provided on said substrate in a manner such that said solar management layer arrangement is located between said glass substrate and said DLC inclusive layer.

37. The coated article of claim 36, wherein said IR reflecting layer comprises silver (Ag).

38. The coated article of claim 36, further comprising a first NiCr inclusive layer located between said IR reflecting layer and said first silicon nitride inclusive layer, and a second NiCr inclusive layer located between said IR reflecting layer and said second silicon nitride inclusive layer.

39. A coated article comprising:
   a glass substrate supporting a coating including the following layers:
   a) a first dielectric layer;
   b) a first contact layer;
   c) a metallic IR reflecting layer comprising one of Ag and NiCr;
   d) a second contact layer, wherein the IR reflecting layer is provided between and in contact with the first and second contact layers;
   e) a second dielectric layer, wherein layers b) through d) are provided between layers a) and e); and
   f) a layer comprising amorphous diamond-like carbon (DLC) having more $sp^3$ carbon-carbon bonds than $sp^2$ carbon-carbon bonds provided over layers a) through e).

40. The coated article of claim 39, wherein each of said first and second contact layers comprise oxides of NiCr.

41. The coated article of claim 39, wherein the second dielectric layer comprises silicon nitride, and wherein C atoms of said layer comprising DLC are subimplanted into said second dielectric layer comprising silicon nitride.

42. The coated article of claim 39, wherein the layer f) comprising DLC is hydrogenated so as to include hydrogen.

43. The coated article of claim 39, wherein the coating has a sheet resistance ($R_s$) of less than 300 ohms/square.

44. The coated article of claim 43, wherein the coated article has a visible transmission of from 60–80%.

45. The coated article of claim 39, wherein the coating has a sheet resistance ($R_s$) of less than 20 ohms/square.

46. A coated article comprising:
   a glass substrate;
   a solar management coating system provided on said substrate, said solar management coating system including at least one infrared (IR) reflecting layer provided between first and second dielectric layers, and a protective substantially non-crystalline layer comprising amorphous diamond-like carbon (DLC) having more $sp^3$ carbon-carbon bonds than $sp^2$ carbon-carbon bonds;
   wherein said first dielectric layer is located between said layer comprising DLC and said IR reflecting layer;
   wherein the solar management coating system including the IR reflecting layer has a sheet resistance ($R_s$) of less than 300 ohms/square; and
   wherein the coated article has a visible transmission of from 60–80%.

47. The coated article of claim 46, wherein the solar management coating system including the IR reflecting layer has a sheet resistance ($R_s$) of less than 20 ohms/square.

48. The coated article of claim 46, wherein the IR reflecting layer comprises one of NiCr and Ag.

49. The coated article of claim 46, further comprising first and second contact layers located between the first and second dielectric layers and the IR reflecting layer, respectively.

50. The coated article of claim 46, wherein the first and second dielectric layers comprise silicon nitride.

* * * * *